United States Patent
Zhao et al.

(10) Patent No.: US 10,354,841 B2
(45) Date of Patent: Jul. 16, 2019

(54) PLASMA GENERATION AND CONTROL USING A DC RING

(71) Applicant: Tokyo Electron Limited, Minato-ku, Tokyo (JP)

(72) Inventors: Jianping Zhao, Austin, TX (US); Lee Chen, Cedar Creek, TX (US); Barton G. Lane, Austin, TX (US); Merritt Funk, Austin, TX (US); Radha Sundararajan, Sugar Land, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 25 days.

(21) Appl. No.: 15/093,031

(22) Filed: Apr. 7, 2016

(65) Prior Publication Data

US 2016/0300738 A1    Oct. 13, 2016

Related U.S. Application Data

(60) Provisional application No. 62/144,128, filed on Apr. 7, 2015.

(51) Int. Cl.
| | |
|---|---|
| *C23C 16/00* | (2006.01) |
| *C23F 1/00* | (2006.01) |
| *H01L 21/306* | (2006.01) |
| *H01J 37/32* | (2006.01) |

(52) U.S. Cl.
CPC .... *H01J 37/3244* (2013.01); *H01J 37/32192* (2013.01); *H01J 37/32568* (2013.01); *H01J 37/32577* (2013.01)

(58) Field of Classification Search
USPC ............................. 118/723 MW; 156/345.41
See application file for complete search history.

(56) References Cited

U.S. PATENT DOCUMENTS

| | | | | |
|---|---|---|---|---|
| 4,492,620 A | * | 1/1985 | Matsuo ................ | C23C 14/357 204/192.12 |
| 5,304,277 A | * | 4/1994 | Ohara ............... | H01J 37/32192 118/723 MA |
| 6,446,572 B1 | * | 9/2002 | Brcka ..................... | C23C 14/32 118/723 AN |
| 2003/0230385 A1 | * | 12/2003 | Bach ................ | H01J 37/32009 156/345.49 |
| 2006/0066247 A1 | * | 3/2006 | Koshiishi .......... | H01J 37/32018 315/111.21 |
| 2009/0236314 A1 | * | 9/2009 | Chen ................. | H01J 37/32091 216/67 |
| 2011/0294303 A1 | * | 12/2011 | Sankarakrishnan .... | C23C 16/46 438/758 |
| 2013/0093321 A1 | * | 4/2013 | Yoshikawa ....... | H01J 37/32192 315/39 |
| 2013/0192760 A1 | * | 8/2013 | Ikeda ................ | H01J 37/32027 156/345.41 |
| 2013/0302992 A1 | * | 11/2013 | Nozawa ........... | H01J 37/32192 438/714 |

* cited by examiner

*Primary Examiner* — Rakesh K Dhingra
(74) *Attorney, Agent, or Firm* — Rothwell, Figg, Ernst & Manbeck, P.C.

(57) ABSTRACT

The present invention provides a SWP (surface wave plasma) processing system that does not create underdense conditions when operating at low microwave power and high gas pressure, thereby achieving a larger process window. The DC ring subsystem can be used to adjust the edge to central plasma density ratio to achieve uniformity control in the SWP processing system.

17 Claims, 15 Drawing Sheets

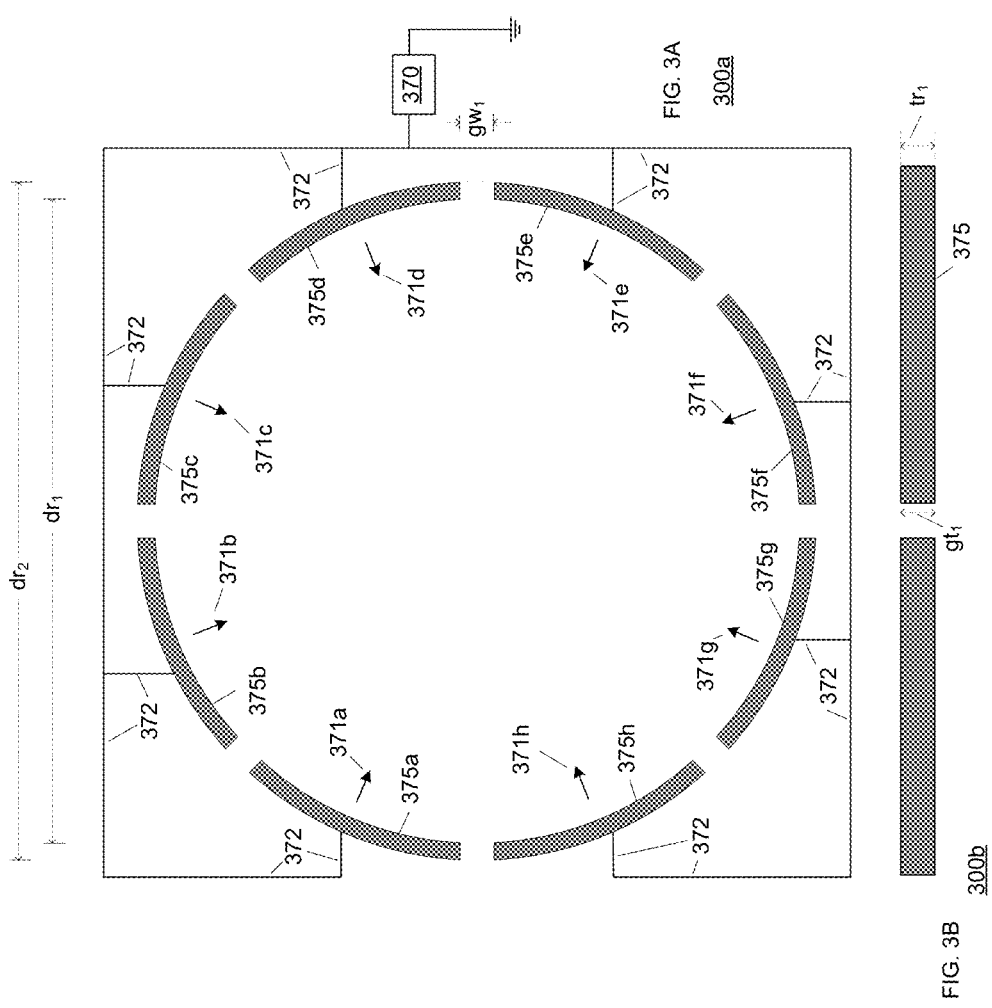

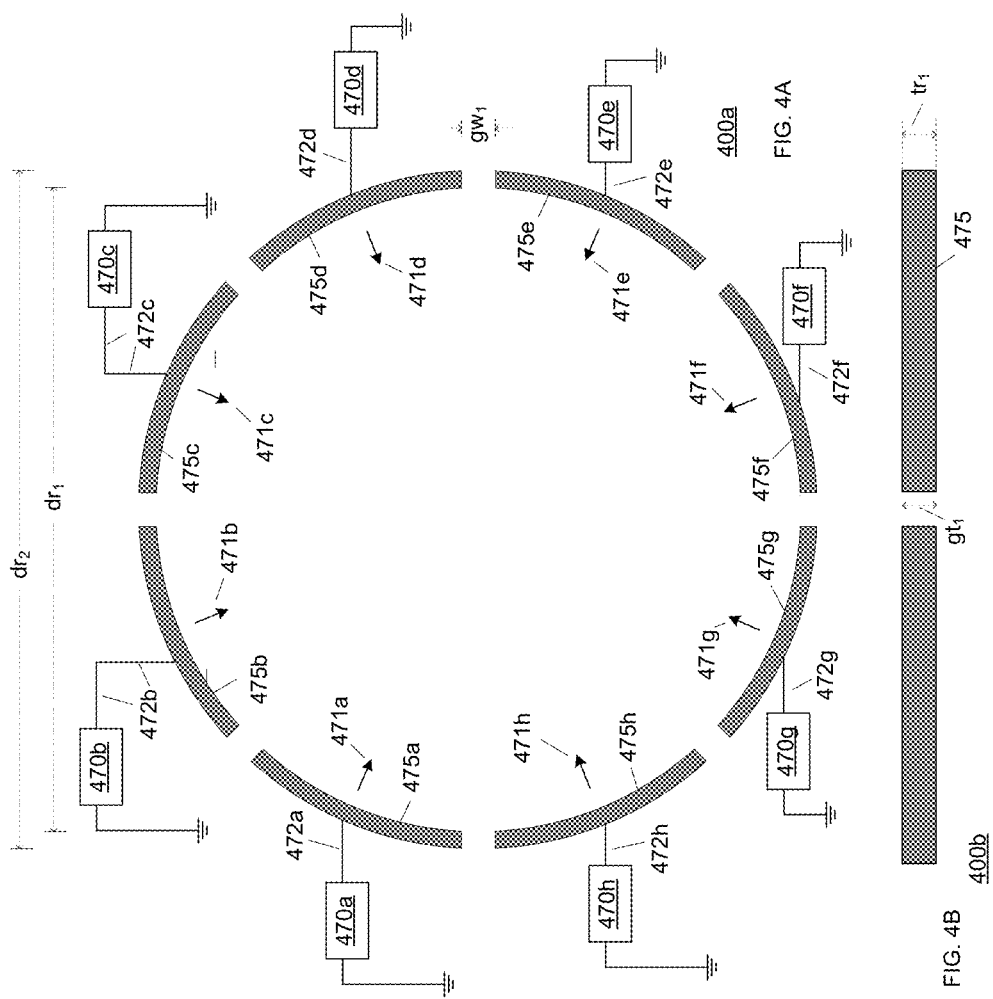

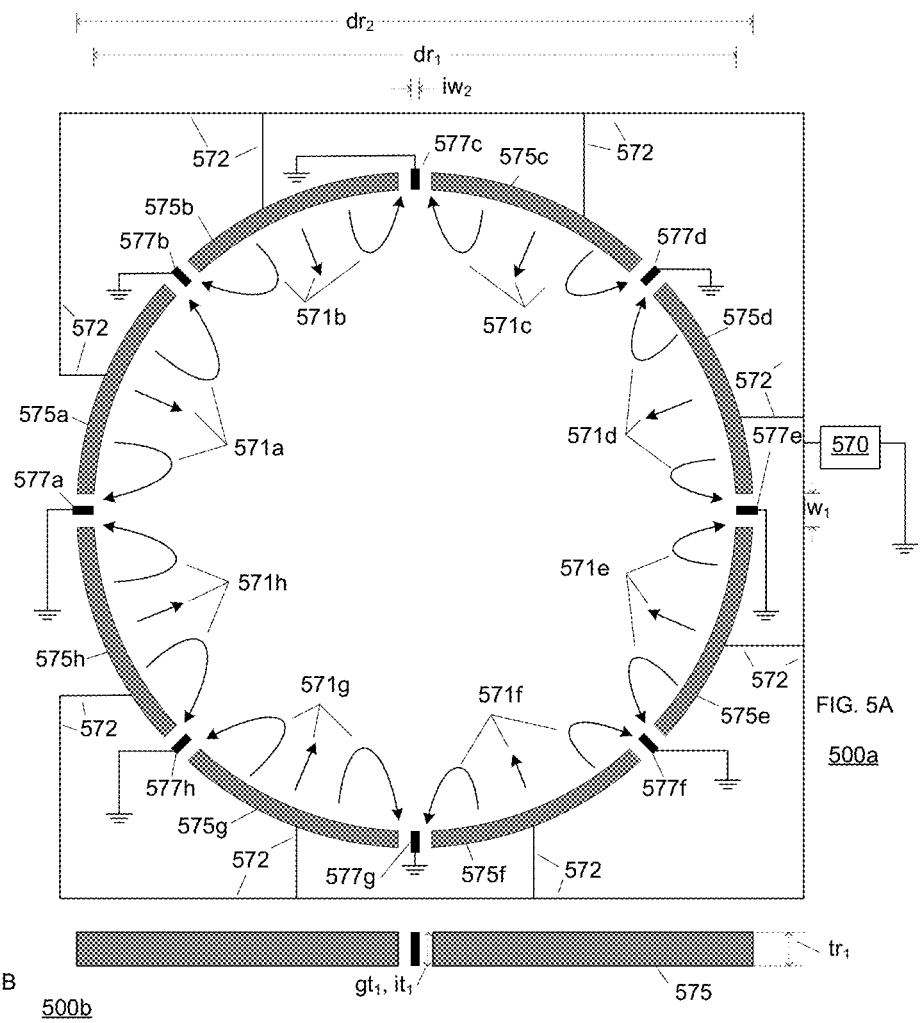

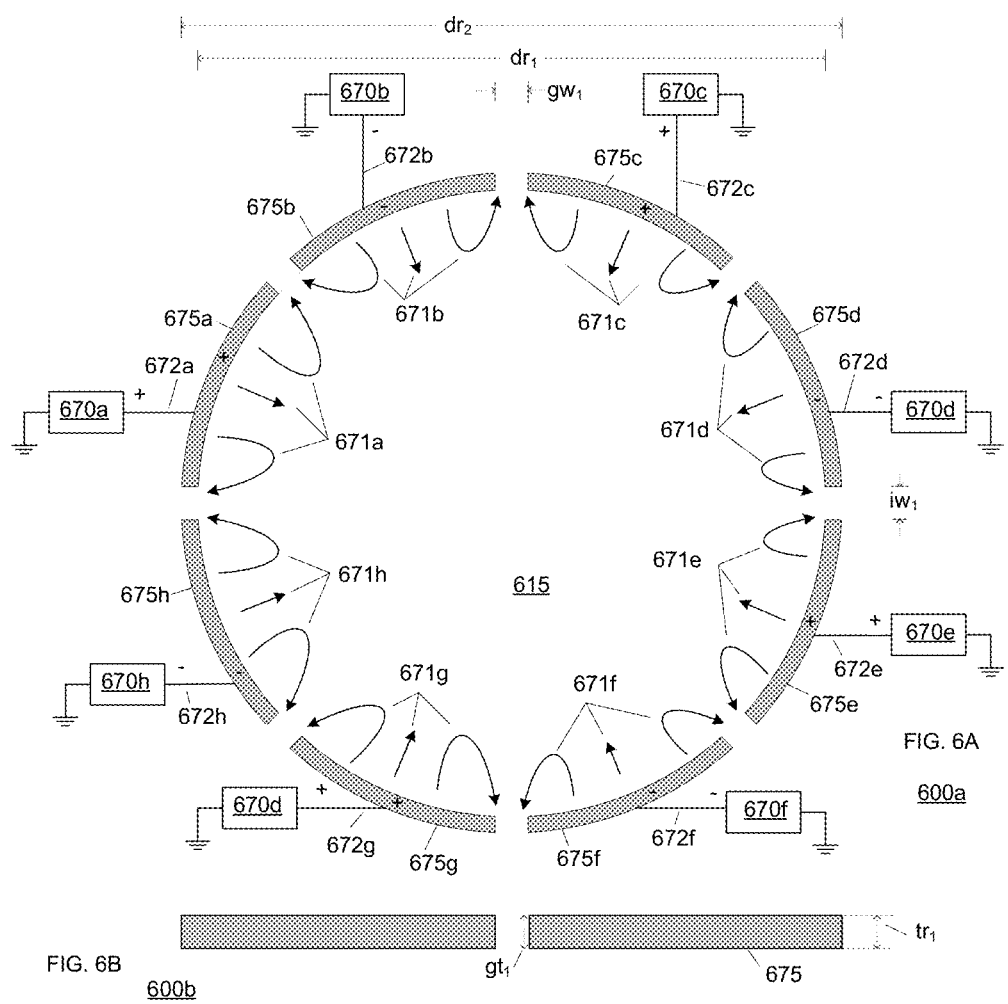

700a

700b

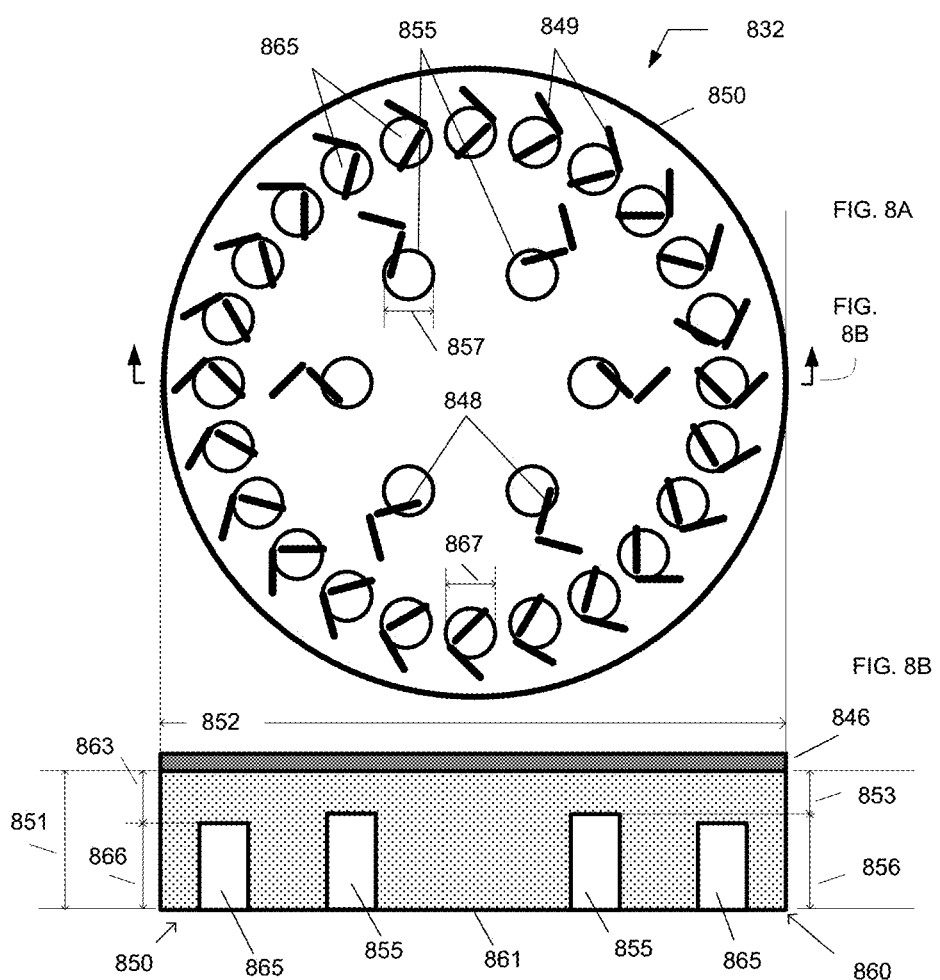

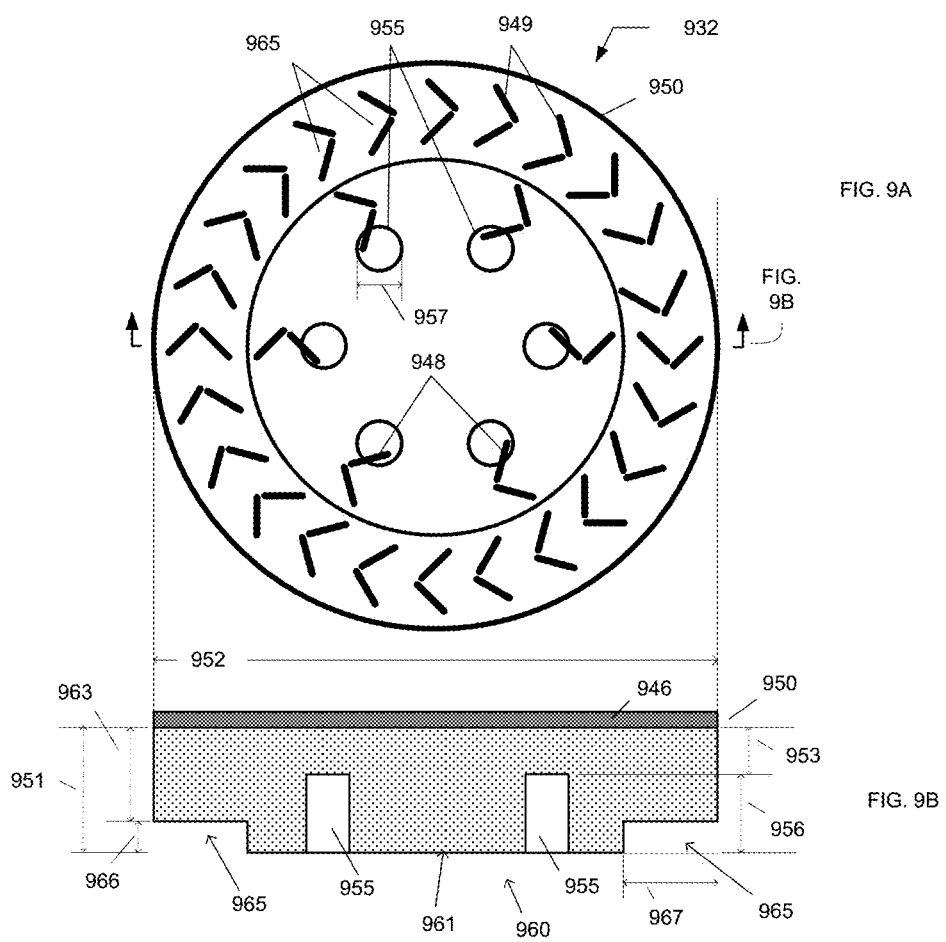

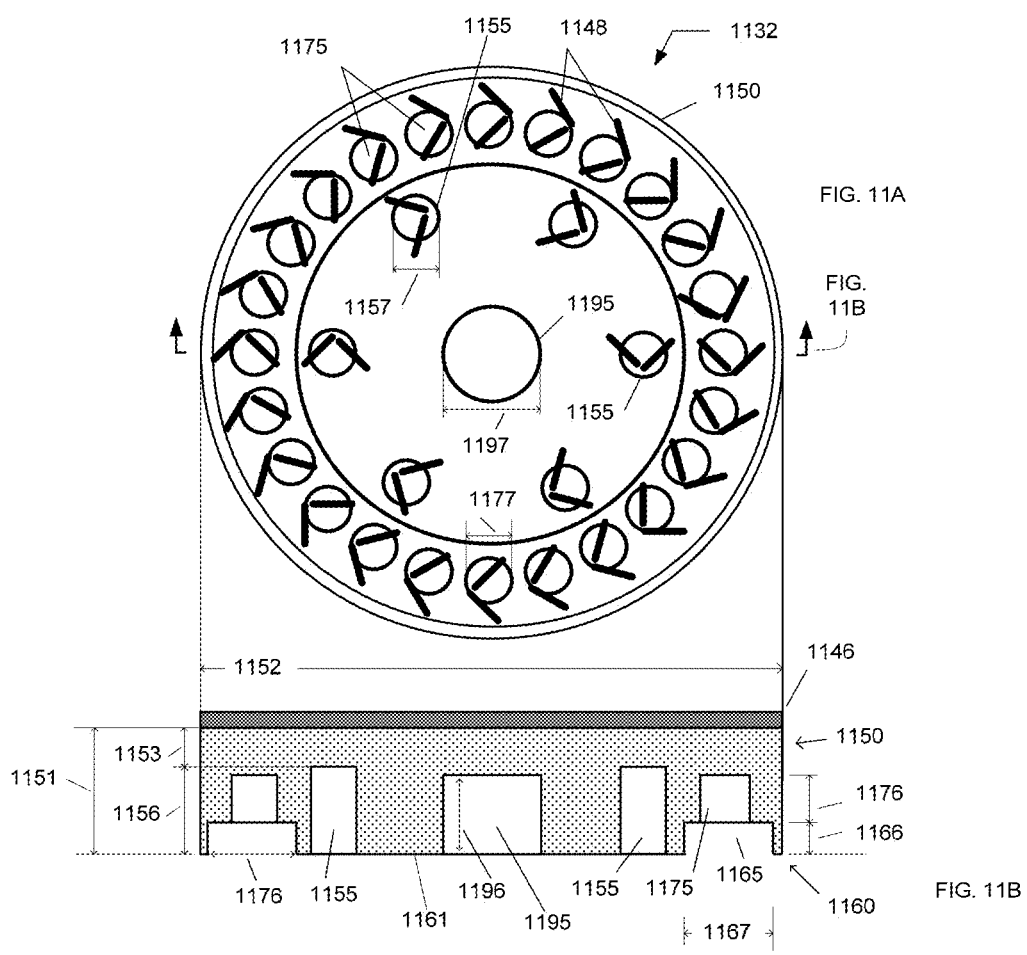

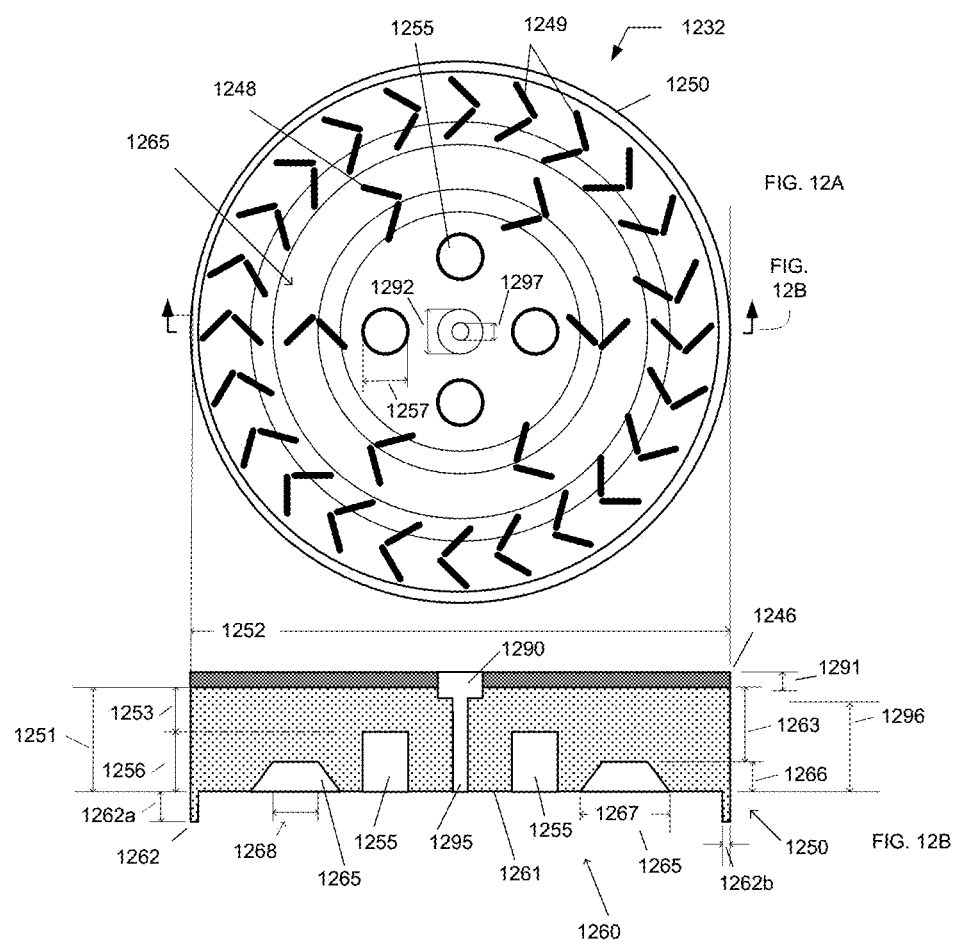

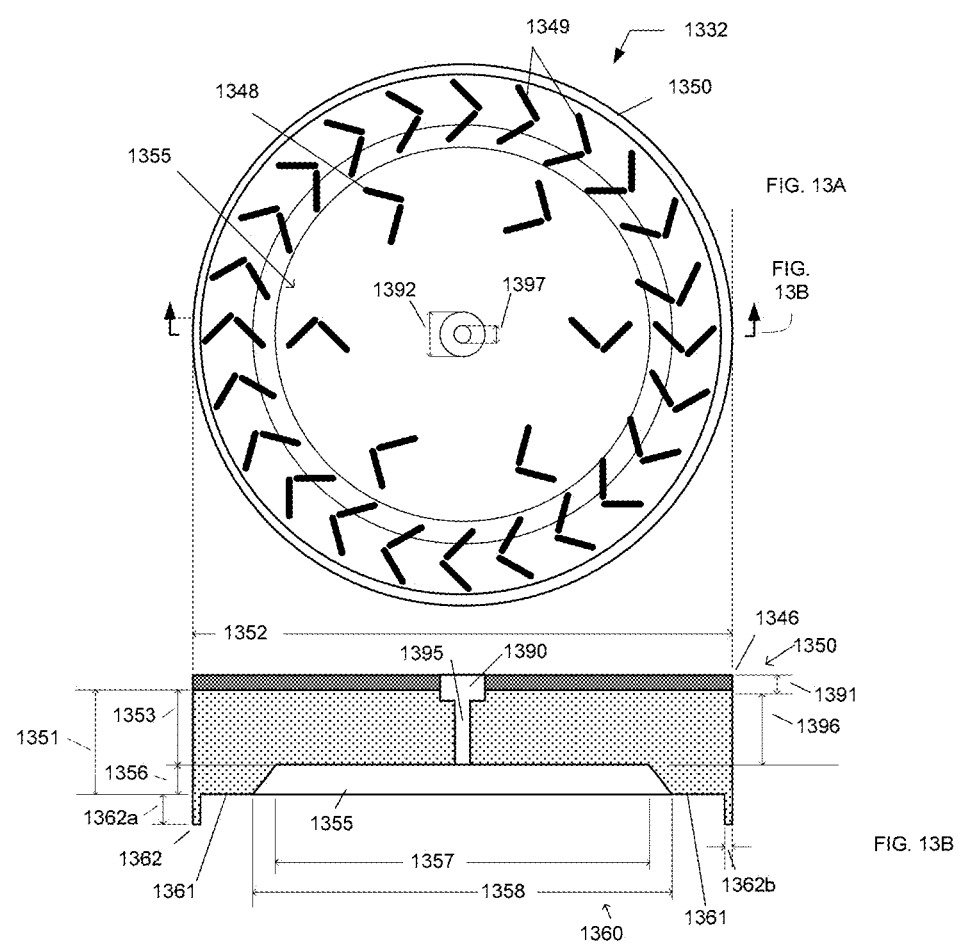

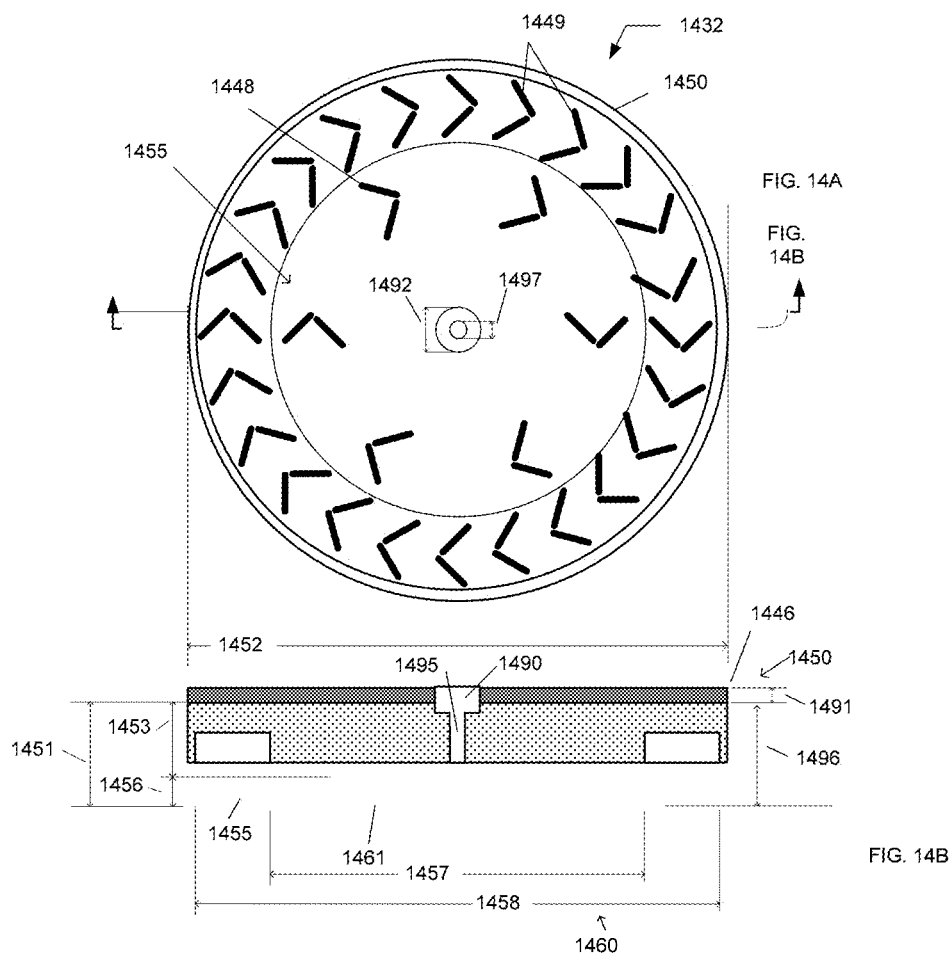

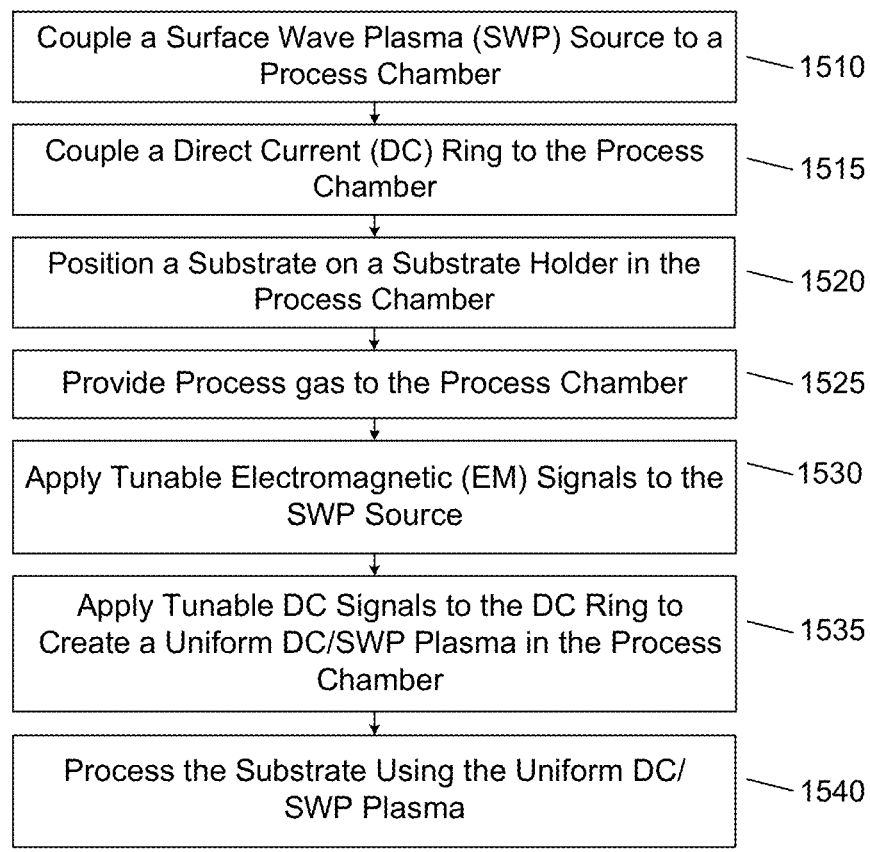
FIG. 15    1500

PLASMA GENERATION AND CONTROL USING A DC RING

This application is based on and claims the benefit of and priority to U.S. Provisional Patent Application No. 62/144,128, entitled "Plasma Generation and Control using a DC Ring", filed on Apr. 7, 2015, the entire contents of which are herein incorporated by reference.

BACKGROUND OF THE INVENTION

Field of the Invention

The present invention relates to substrate/wafer processing, and more particularly to Surface Wave Plasma (SWP) processing systems and methods for processing substrates and/or semiconductor wafers using SWP processing systems.

Description of the Related Art

Typically, during semiconductor processing, a (dry) plasma etch process is utilized to remove or etch material along fine lines or within vias or contacts patterned on a semiconductor substrate. The plasma etch process generally involves positioning a semiconductor substrate with an overlying patterned, protective layer, for example a photoresist layer, into a process chamber.

Once the substrate is positioned within the chamber, an ionizable, dissociative gas mixture is introduced within the chamber at a pre-specified flow rate, while a vacuum pump is throttled to achieve an ambient process pressure. Thereafter, a plasma is formed when a portion of the gas species present are ionized following a collision with an energetic electron. Moreover, the heated electrons serve to dissociate some species of the mixture gas species and create reactant specie(s) suitable for the etching exposed surfaces. Once the plasma is formed, any exposed surfaces of the substrate are etched by the plasma. The process is adjusted to achieve optimal conditions, including an appropriate concentration of desirable reactant and ion populations to etch various features (e.g., trenches, vias, contacts, etc.) in the exposed regions of substrate. Such substrate materials where etching is required include silicon dioxide ($SiO_2$), poly-silicon, and silicon nitride, for example.

Conventionally, various techniques have been implemented for exciting a gas into plasma for the treatment of a substrate during semiconductor device fabrication, as described above. In particular, ("parallel plate") capacitively coupled plasma (CCP) processing systems, or inductively coupled plasma (ICP) processing systems have been utilized commonly for plasma excitation. Among other types of plasma sources, there are microwave plasma sources (including those utilizing electron-cyclotron resonance (ECR)), surface wave plasma (SWP) sources, and helicon plasma sources.

It is becoming common wisdom that microwave SWP systems offer improved plasma processing performance, particularly for etching processes, over CCP systems, ICP systems and resonantly heated systems. Microwave SWP systems produce a high degree of ionization at a relatively lower Boltzmann electron temperature ($T_e$). In addition, SWP sources generally produce plasma richer in electronically excited molecular species with reduced molecular dissociation. However, the practical implementation of microwave SWP systems still suffers from several deficiencies including, for example, plasma stability and uniformity. SWP plasma is a diffusion plasma in nature and is non-uniform in a radial distribution, and can sometimes have center-high and edge-low plasma densities. Adding a uniformity control knob can improve the SWP plasma uniformity.

SUMMARY OF THE INVENTION

Microwave SWP plasma can become underdense when operating at low microwave power and high pressure or operating in pulsing mode, and in these systems, one or more auxiliary ionization sources can be added to avoid the underdense situations and enlarge the operating window. For example, making the microwave SWP plasma into an overdense plasma can be a solution.

In various embodiments, a DC ring or a DC electric multiple bucket which can be biased negatively and continually/pulsed or pulsing biased positively and negatively can be used to prevent plasma from going to underdense because of the emission of secondary electrons from the surface of the DC ring and confined ionization due to hollow cathode effect. The DC electric multiple bucket can also confine and enhance the ionization just near the DC ring, which is located at the edge of the chamber and below the SWP window. In addition, the DC ring can also be used in other types of plasma sources, such as inductively-coupled (ICP) plasma sources, and capacitively-coupled (CCP) plasma sources.

In some configurations, a Surface Wave Plasma (SWP) source can be combined with a DC ring subsystem and a bottom RF subsystem in one SWP processing system, and these subsystems can be used together or individually depending on application. The DC ring can be operated along and maintain the discharge after the first ignition using other plasma sources, such as SWP sources.

The present invention provides a SWP processing system that does not create underdense conditions when operating at low microwave power and high gas pressure, thereby achieving a larger process window. The DC ring subsystem can be used to adjust the edge to central plasma density ratio to achieve uniformity control in the SWP processing system.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIGS. 3A-3B illustrate simplified views of a third exemplary power subsystem, a third exemplary distribution subsystem, and a third exemplary ring subsystem in accordance with embodiments of the invention;

FIGS. 4A-4B illustrate simplified views of a fourth exemplary power subsystem, a fourth exemplary distribution subsystem, and a fourth exemplary ring subsystem in accordance with embodiments of the invention;

FIGS. 5A-5B illustrate simplified views of a fifth exemplary power subsystem, a fifth exemplary distribution subsystem, and a fifth exemplary ring subsystem in accordance with embodiments of the invention;

FIGS. 6A-6B illustrate simplified views of a sixth exemplary power subsystem, a sixth exemplary distribution subsystem, and a sixth exemplary ring subsystem in accordance with embodiments of the invention;

FIGS. 8A and 8B illustrate exemplary views of a first EM wave launcher in accordance with embodiments;

FIGS. 9A and 9B illustrate exemplary views of a second EM wave launcher in accordance with embodiments;

FIGS. 11A and 11B illustrate exemplary views of a fourth EM wave launcher in accordance with embodiments;

FIGS. 12A and 12B illustrate exemplary views of a fifth EM wave launcher in accordance with embodiments;

FIGS. 13A and 13B illustrate exemplary views of a sixth EM wave launcher in accordance with embodiments;

FIGS. 14A and 14B illustrate exemplary views of a seventh EM wave launcher in accordance with embodiments; and FIG. 15 illustrates a flow diagram for an exemplary operating procedure for a SWP processing system in accordance with embodiments of the invention.

DETAILED DESCRIPTION

Figure 1:
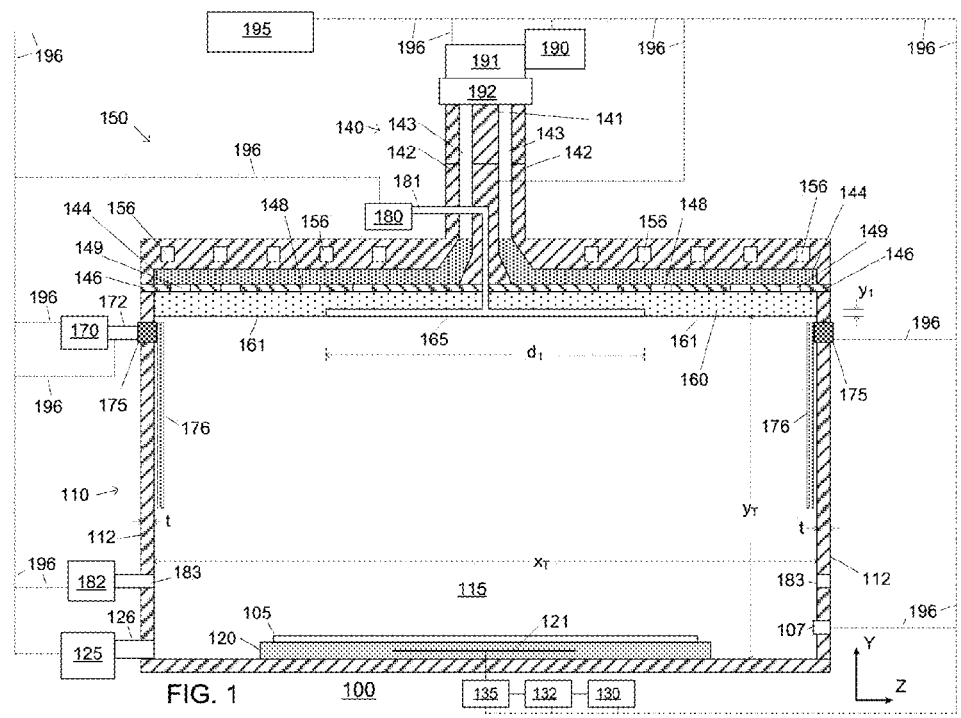
FIG. 1 illustrates an exemplary view of a Surface Wave Plasma (SWP) processing system according to embodiments of the invention.

SWP plasma sources and SWP processing systems are disclosed in various embodiments. However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention.

Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" or variation thereof means that a particular feature, structure, material, or characteristic described in connection with the embodiment is included in at least one embodiment of the invention, but do not denote that they are present in every embodiment. Thus, the appearances of the phrases such as "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Nonetheless, it should be appreciated that, contained within the description are features, which, notwithstanding the inventive nature of the general concepts being explained, are also of an inventive nature.

Referring now to the drawings, wherein like reference numerals designate identical or corresponding parts throughout the several views, FIG. 1A illustrates a first Surface Wave Plasma (SWP) processing system 100 according to embodiments of the invention. The SWP processing system 100 may be used in a dry plasma etching system or a plasma enhanced deposition system.

FIG. 1 illustrates a first SWP processing system in accordance with embodiments of the invention. The SWP processing system 100 can comprise a Surface Wave Plasma (SWP) source 150 having a slot antenna 146 therein. Alternatively, the SWP processing system 100 may be configured differently.

The SWP processing system 100 can comprise a process chamber 110 configured to define a process space 115. The process chamber 110 that can be configured using a resonator plate 160 and a plurality of chamber walls 112 coupled to each other and the resonator plate 160. For example, the chamber walls 112 can have wall thicknesses (t) associated therewith, and the wall thicknesses (t) can vary from about 1 mm to about 5 mm. The resonator plate 160 have a resonator plate thickness associated therewith, and the resonator plate thickness can vary from about 1 mm to about 10 mm. The resonator plate 160 can have one or more recesses 165 associated therewith, and the diameter ($d_1$) of the recesses 165 can vary from about 1 mm to about 50 mm.

The process chamber 110 can comprise a substrate holder 120 configured to support a substrate 105. The substrate 105 can be exposed to plasma and/or process chemistry in process space 115. The SWP processing system 100 can comprise a SWP source 150 coupled to the process chamber 110, and configured to form plasma in the process space 115.

One or more electromagnetic (EM) sources 190 can be coupled to the SWP source 150, and the EM energy generated by the EM source 190 can flow through a match network/phase shifter 191 to a tuner network/isolator 192 for absorbing EM energy reflected back to the EM source 190. The EM energy can be converted to a TEM (transverse electromagnetic) mode via the tuner network/isolator 192. A tuner may be employed for impedance matching, and improved power transfer. For example, the EM source 190, the match network/phase shifter 191, and the tuner network/isolator 192 can operate from about 500 MHz to about 5000 MHz.

The SWP source 150 can comprise a feed assembly 140 having an inner conductor 141, an outer conductor 142, an insulator 143, and a slot antenna 146 having a plurality of first slots 148 and a plurality of second slots 149 coupled between the inner conductor 141 and the outer conductor 142. The plurality of slots (148 and 149) permits the coupling of EM energy from a first region above the slot antenna 146 to a second region below the slot antenna 146.

The design of the slot antenna 146 can be used to control the spatial uniformity of the plasma in process space 115. For example, the number, geometry, size, and distribution of the slots (148, and 149) are all factors that can contribute to the spatial uniformity of the plasma formed in the process space 115.

Some exemplary SWP sources 150 can comprise a slow wave plate 144, and the design of the slow wave plate 144 can be used to control the spatial uniformity of the plasma in process space 115. For example, the geometry, size, and plate material can be factors that can contribute to the spatial uniformity of the plasma formed in the process space 115. Alternatively, the slow wave plate 144 may be configured differently or may not be required.

Other exemplary SWP sources 150 can comprise a resonator plate 160, and the design of the resonator plate 160 can be used to control the spatial uniformity of the plasma in process space 115. For example, the geometry, size, and the resonator plate material can be factors that can contribute to the spatial uniformity of the plasma formed in the process space 115. Alternatively, the resonator plate 160 may be configured differently or may not be required.

Alternatively, the SWP sources may comprise a cover plate (not shown), and the design of the cover plate may be used to control the spatial uniformity of the plasma in process space 115. For example, the geometry, size, and the cover plate material may be factors that can contribute to the spatial uniformity of the plasma formed in the process space 115.

Other additional exemplary SWP sources 150 can comprise one or more fluid channels 156 that can be configured to flow a temperature control fluid for temperature control of the SWP source 150. The design of the fluid channels 156 can be used to control the spatial uniformity of the plasma in process space 115. For example, the geometry, size, and flow rate of the fluid channels 156 can be factors that can contribute to the spatial uniformity of the plasma formed in the process space 115. Alternatively, the fluid channels 156 may be configured differently or may not be required.

The EM energy can be coupled to the SWP source 150 via the feed assembly 140, wherein another mode change occurs from the TEM mode in the feed assembly 140 to a TM (transverse magnetic) mode. Additional details regarding the design of the feed assembly 140 and the slot antenna 146 can be found in U.S. Pat. No. 5,024,716, entitled "Plasma processing apparatus for etching, ashing, and film-formation"; the content of which is herein incorporated by reference in its entirety.

The first recesses 165 can extend first depths ($y_1$) into the resonator plate 160, and the first depths ($y_1$) can be established relative to the plasma-facing surface 161 of the resonator plate 160. The first depths ($y_1$) can be wavelength-dependent and can vary from about ($\lambda/20$) to about ($10\lambda$). Alternatively, the first depths ($y_1$) may vary from about 1 mm to about 5 mm. For example, the first diameter ($d_1$) of the recesses 165 and the first depths ($y_1$) can be factors that can contribute to the spatial uniformity of the plasma formed in the process space 115. Alternatively, the first recesses 165 may be configured differently or may not be required.

The SWP processing system 100 can comprise a power subsystem 170 that can be coupled to a distribution subsystem 172, and the distribution subsystem 172 can be coupled to a Direct Current (DC) ring subsystem 175. The DC ring subsystem 175 can be coupled through the chamber wall 112 and can be configured to surround the process space 115. During operation, the DC ring subsystem 175 can provide secondary electrons to the process space and create a cylindrical diffusion column 176 that can surround the process space 115.

In some embodiments, the power subsystem 170 can provide DC signals to the distribution subsystem 172 and the DC ring subsystem 175. For example, the DC signals can include positive DC voltages, negative DC voltages, or pulsed DC voltages, or any combination thereof, and the DC signals can vary from about −5000 V to about +5000 V. Alternatively, the power subsystem 170 can provide alternating current (AC) signals to the distribution subsystem 172 and the DC ring subsystem 175.

In some embodiments, the DC ring subsystem 175 can be configured as a cylindrical ring structure and can include can include metallic components, semiconductor components, dielectric components, switching elements, measuring elements, protection elements, isolation elements, combining elements, and/or separating elements. In other embodiments, the DC ring subsystem 175 can be configured as a segmented cylindrical ring structure, and the distribution subsystem 172 can be coupled to each segment in the segmented cylindrical ring structure.

In various embodiments, the distribution subsystem 172 can include metallic components, semiconductor components, switching elements, measuring elements, protection elements, isolation elements, combining elements, and/or separating elements.

The controller 195 can be coupled to the power subsystem 170, the distribution subsystem 172, and the DC ring subsystem 175, and the controller 195 can use process recipes to establish, control, and optimize the power subsystem 170, the distribution subsystem 172, and the DC ring subsystem 175 to control the plasma uniformity within the process space 115.

In some embodiments, the SWP processing system 100 can be configured to form plasma in the process space 115 as the substrate holder 120 and the substrate are positioned within the process space 115. Alternatively, the SWP processing system 100 may be configured to form plasma in the process space 115 as the substrate holder 120 and the substrate are moved through the process space 115.

The controller 195 can be coupled 196 to the EM source 190, the match network/phase shifter 191, and the tuner network/isolator 192, and the controller 195 can use process recipes to establish, control, and optimize the EM source 190, the match network/phase shifter 191, and the tuner network/isolator 192 to control the plasma uniformity within the process space 115. For example, the EM source 190 can operate at frequencies from about 500 MHz to about 5000 MHz. In addition, the controller 195 can be coupled 196 to the process sensors 107, and the controller 195 can use process recipes to establish, control, and optimize the data from the process sensors 107 to control the plasma uniformity within the process space 115.

Some of the SWP processing systems 100 can include a pressure control system 125 and exhaust port 126 coupled to the process chamber 110, and configured to evacuate the process chamber 110, as well as control the pressure within the process chamber 110. Alternatively, the pressure control system 125 and/or the exhaust port 126 may not be required.

As shown in FIG. 1, the SWP processing system 100 can comprise a first gas supply system 180 coupled to one or more first flow elements 181 that can be coupled to upper portion of the process chamber 110. The first flow elements 181 can be configured to introduce a first process gas through the first recess 165 and into the process space 115, and can include flow control and/or flow measuring devices. In addition, the SWP processing system 100 can comprise a second gas supply system 182 coupled to one or more second flow elements 183 that can be coupled to the process chamber 110. The second flow elements 183 can be configured to introduce a second process gas to process space 115, and can include flow control and/or flow measuring devices. Alternatively, the second gas supply system 182 and/or the second flow elements 183 may be configured differently or may not be required.

During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (poliesilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

Still referring to FIG. 1A, a substrate holder 120, and a lower electrode 121 are shown. When present, the lower electrode 121 can be used to couple Radio Frequency (RF) power to plasma in process space 115. For example, lower electrode 121 can be electrically biased at an RF voltage via the transmission of RF power from RF generator 130 through impedance match network 131 and RF sensor 135 to lower electrode 121. The RF bias can serve to heat electrons to form and/or maintain the plasma. A typical frequency for the RF bias can range from 1 MHz to 100 MHz and is preferably 13.56 MHz. Alternatively, RF power may be applied to the lower electrode 121 at multiple frequencies. Furthermore, impedance match network 131 can serve to maximize the transfer of RF power to the plasma in process chamber 110 by minimizing the reflected power, and the RF power can vary from about 0 watts to about 5000 watts. Various match network topologies and automatic control methods can be utilized. The RF sensor 135 can measure the power levels and/or frequencies associated with the fundamental signals, harmonic signals, and/or intermodulation signals. In addition, the controller 195 can be coupled 196 to the RF generator 130, the impedance match network 131, and the RF sensor 135, and the controller 195 can use process recipes to establish, control, and optimize the data to and from the RF generator 130, the impedance match network 131, and the RF sensor 135 to control the DC/SWP plasma uniformity within the process space 115.

Some of the SWP processing systems 100 can include a pressure control system 125 and exhaust port 126 coupled to the process chamber 110, and configured to evacuate the process chamber 110, as well as control the pressure within the process chamber 110. Alternatively, the pressure control system 125 and/or the exhaust port 126 may not be required or configured differently.

Figure 2A:
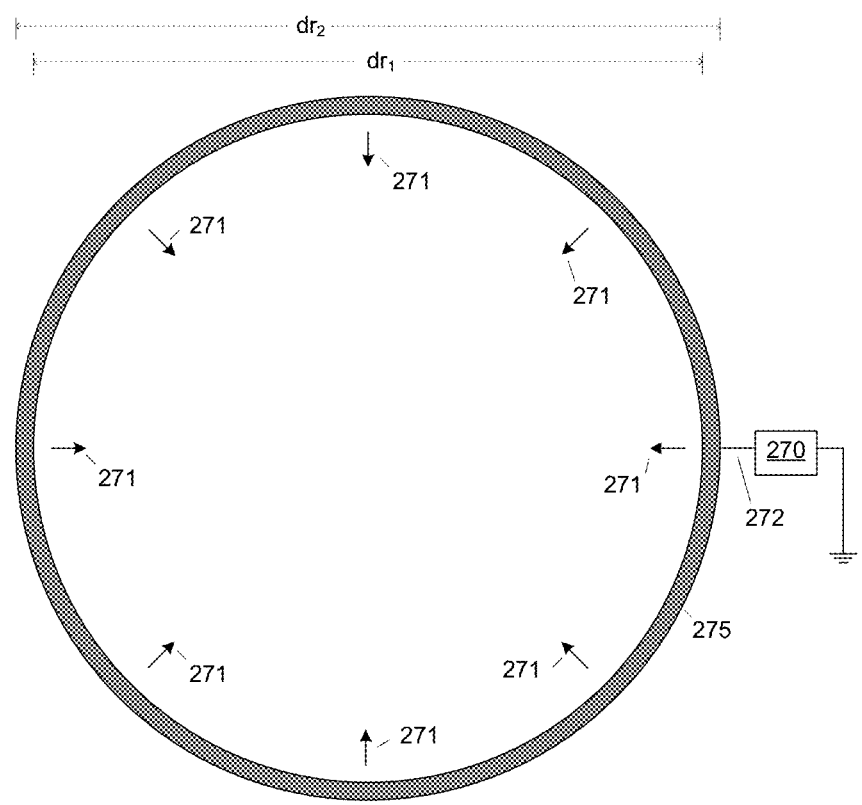
FIGS. 2A-2B illustrate simplified views of a second exemplary power subsystem, a second exemplary distribution subsystem, and a second exemplary ring subsystem in accordance with embodiments of the invention.
Figure 2B:
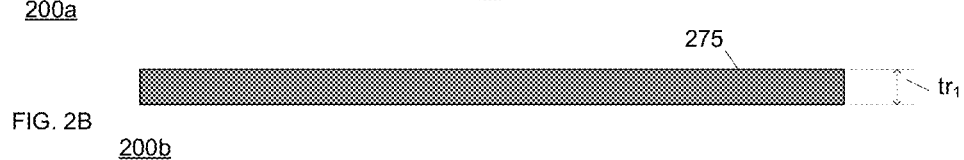

FIGS. 2A-2B illustrate simplified views of a second exemplary power subsystem, a second exemplary distribution subsystem, and a second exemplary ring subsystem in accordance with embodiments of the invention.

In FIG. 2A, the top view 200a shows an exemplary power subsystem 270 coupled to an exemplary distribution subsystem 272 that is coupled to an exemplary ring subsystem 275. As shown in FIG. 2A, the ring subsystem 275 can be configured as a cylindrical ring structure and can include can include metallic components, semiconductor components, dielectric components, switching elements, measuring elements, protection elements, isolation elements, combining elements, and/or separating elements. The ring subsystem 275 can be coupled to a distribution subsystem 272, and the distribution subsystem 272 can be coupled to a power subsystem 270. During operation, the ring subsystem 275 can provide secondary electrons 271 to the space inside the cylindrical ring structure of the ring subsystem 275.

In some embodiments, the power subsystem 270 can provide DC signals to the distribution subsystem 272 and the ring subsystem 275. For example, the DC signals can include positive DC voltages, negative DC voltages, or pulsed DC voltages, or any combination thereof, and the DC signals can vary from about −5000 V to about +5000 V. Alternatively, the power subsystem 270 can provide AC signals to the distribution subsystem 272 and the ring subsystem 275.

The ring subsystem 275 can have an inner diameter ($d_{r1}$) and an outer diameter ($d_{r2}$). The inner diameter ($d_{r1}$) and the outer diameter ($d_{r2}$) can be dependent upon the size of the process chamber (FIG. 1, 110) and can vary from about 100 mm to about 500 mm. The difference between the inner diameter ($d_{r1}$) and the outer diameter ($d_{r2}$) can be dependent upon the size of the chamber walls (FIG. 1, 112) and can vary from about 5 mm to about 50 mm. Alternatively, the ring subsystem 275 may be configured differently.

In FIG. 2B, a side view 200b shows a side view of the ring subsystem 275. The ring subsystem 275 can have a thickness ($t_{r1}$). The thickness ($t_{r1}$) can be dependent upon the size of the process chamber (FIG. 1, 110) and can vary from about 10 mm to about 50 mm.

FIGS. 3A-3B illustrate simplified views of a third exemplary power subsystem, a third exemplary distribution subsystem, and a third exemplary ring subsystem in accordance with embodiments of the invention.

In FIG. 3A, the top view 300a shows a third exemplary power subsystem 370 coupled to a third exemplary distribution subsystem 372 that is coupled to a third exemplary ring subsystem 375. As shown in FIG. 3A, the third ring subsystem 375 can be configured as a segmented cylindrical ring structure and can include can include metallic components, semiconductor components, dielectric components, switching elements, measuring elements, protection elements, isolation elements, combining elements, and/or separating elements. The third ring subsystem 375 can be coupled to a third distribution subsystem 372, and the third distribution subsystem 372 can be coupled to a third power subsystem 370. During operation, the third ring subsystem (375a, 375b, 375c, 375d, 375e, 375f, 375g, and 375h) can provide secondary electrons (371a, 371b, 371c, 371d, 371e, 371f, 371g, and 371h) to the space inside the segmented cylindrical ring structure of the ring subsystem (375a, 375b, 375c, 375d, 375e, 375f, 375g, and 375h).

In some embodiments, the third power subsystem 370 can provide DC signals to the third distribution subsystem 372 and the third ring subsystem (375a, 375b, 375c, 375d, 375e, 375f, 375g, and 375h). For example, the DC signals can include positive DC voltages, negative DC voltages, or pulsed DC voltages, or any combination thereof, and the DC signals can vary from about −5000 V to about +5000 V. Alternatively, the third power subsystem 370 can provide AC signals to the third distribution subsystem 372 and the third ring subsystem (375a, 375b, 375c, 375d, 375e, 375f, 375g, and 375h).

The third ring subsystem (375a, 375b, 375c, 375d, 375e, 375f, 375g, and 375h) can have an inner diameter ($d_{r1}$) and an outer diameter ($d_{r2}$). The inner diameter ($d_{r1}$) and the outer diameter ($d_{r2}$) can be dependent upon the size of the process chamber (FIG. 1, 110) and can vary from about 100 mm to about 500 mm. The difference between the inner diameter ($d_{r1}$) and the outer diameter ($d_{r2}$) can be dependent upon the size of the chamber walls (FIG. 1, 112) and can vary from about 5 mm to about 50 mm. Alternatively, the third ring subsystem (375a, 375b, 375c, 375d, 375e, 375f, 375g, and 375h) may be configured differently.

In FIG. 3B, a side view 300b shows a side view of the third ring subsystem (375a, 375b, 375c, 375d, 375e, 375f, 375g, and 375h). Alternatively, the number of segments may be different. Each of the ring segments (375a, 375b, 375c, 375d, 375e, 375f, 375g, and 375h) can have thicknesses ($t_{r1}$). The thickness ($t_{r1}$) can be dependent upon the size of the process chamber (FIG. 1, 110) and can vary from about 10 mm to about 50 mm. Alternatively, the segment thicknesses ($t_{r1}$) may be different. Each of the ring segments (375a, 375b, 375c, 375d, 375e, 375f, 375g, and 375h) can have a gap thickness ($g_{r1}$) associated therewith. The gap thicknesses ($g_{r1}$) can be dependent upon the size of the process chamber (FIG. 1, 110) and can vary from about 0.1 mm to about 5 mm. Alternatively, the gap thicknesses ($g_{r1}$) may be different.

FIGS. 4A-4B illustrate simplified views of a fourth exemplary power subsystem, a third exemplary distribution subsystem, and a third exemplary ring subsystem in accordance with embodiments of the invention.

In FIG. 4A, the top view 400a shows a plurality of power subsystems (470a, 470b, 470c, 470d, 470e, 470f, 470g, and 470h) coupled to a plurality of distribution subsystems (472a, 472b, 472c, 472d, 472e, 472f, 472g, and 472h) that can be coupled to a pluarity of ring subsystems (475a, 475b, 475c, 475d, 475e, 475f, 475g, and 475h). For example, the ring subsystems (475a, 475b, 475c, 475d, 475e, 475f, 475g, and 475h) can be configured as a segmented cylindrical ring structure and can include can include metallic components, semiconductor components, dielectric components, switching elements, measuring elements, protection elements, isolation elements, combining elements, and/or separating elements.

A first power subsystem 470a can be coupled to a first distribution subsystem 472a that can be coupled to a first ring subsystem 475a. The first power subsystem 470a can provide first DC signals to the first distribution subsystem 472a and the first ring subsystem 475a. During operation, the first ring subsystem 475a can provide secondary electrons 471a to the space inside the segmented cylindrical ring structure comprising the ring subsystems (475a, 475b, 475c, 475d, 475e, 475f, 475g, and 475h).

A second exemplary power subsystem 470b can be coupled to a second exemplary distribution subsystem 472b that can be coupled to a second exemplary ring subsystem 475b. The second power subsystem 470b can provide second DC signals to the second distribution subsystem 472b and the second ring subsystem 475b. During operation, the second ring subsystem 475b can provide a second set of secondary electrons 471b to the space inside the segmented cylindrical ring structure comprising the ring subsystems (475a, 475b, 475c, 475d, 475e, 475f, 475g, and 475h).

A third exemplary power subsystem 470c can be coupled to a third exemplary distribution subsystem 472c that can be coupled to a third exemplary ring subsystem 475c. The third power subsystem 470c can provide third DC signals to the third distribution subsystem 472c and the third ring subsystem 475c. During operation, the third ring subsystem 475c can provide a third set of secondary electrons 471c to the space inside the segmented cylindrical ring structure comprising the ring subsystems (475a, 475b, 475c, 475d, 475e, 475f, 475g, and 475h).

A fourth exemplary power subsystem 470d can be coupled to a fourth exemplary distribution subsystem 472d that can be coupled to a fourth exemplary ring subsystem 475d. The fourth power subsystem 470d can provide fourth DC signals to the fourth distribution subsystem 472d and the fourth ring subsystem 475d. During operation, the fourth ring subsystem 475d can provide a fourth set of secondary electrons 471d to the space inside the segmented cylindrical ring structure comprising the ring subsystems (475a, 475b, 475c, 475d, 475e, 475f, 475g, and 475h).

A fifth exemplary power subsystem 470e can be coupled to a fifth exemplary distribution subsystem 472e that be coupled to a fifth exemplary ring subsystem 475e. The fifth power subsystem 470e can provide fifth DC signals to the fifth distribution subsystem 472e and the fifth ring subsystem 475e. During operation, the fifth ring subsystem 475e can provide a fifth set of secondary electrons 471e to the space inside the segmented cylindrical ring structure comprising the ring subsystems (475a, 475b, 475c, 475d, 475e, 475f, 475g, and 475h).

A sixth exemplary power subsystem 470f can be coupled to a sixth exemplary distribution subsystem 472f that can be coupled to a sixth exemplary ring subsystem 475f. The sixth power subsystem 470f can provide sixth DC signals to the sixth distribution subsystem 472f and the sixth ring subsystem 475f. During operation, the sixth ring subsystem 475f can provide a sixth set of secondary electrons 471f to the space inside the segmented cylindrical ring structure comprising the ring subsystems (475a, 475b, 475c, 475d, 475e, 475f, 475g, and 475h).

A seventh exemplary power subsystem 470g can be coupled to a seventh exemplary distribution subsystem 472g that can be coupled to a seventh exemplary ring subsystem 475g. The seventh power subsystem 470g can provide seventh DC signals to the seventh distribution subsystem 472g and the seventh ring subsystem 475g. During operation, the seventh ring subsystem 475g can provide a seventh set of secondary electrons 471g to the space inside the segmented cylindrical ring structure comprising the ring subsystems (475a, 475b, 475c, 475d, 475e, 475f, 475g, and 475h).

An eighth exemplary power subsystem 470h can be coupled to an eighth exemplary distribution subsystem 472h that can be coupled to an eighth exemplary ring subsystem 475h. The eighth power subsystem 470h can provide eighth DC signals to the eighth distribution subsystem 472h and the eighth ring subsystem 475h. During operation, the eighth ring subsystem 475h can provide an eighth set of secondary electrons 471h to the space inside the segmented cylindrical ring structure comprising the ring subsystems (475a, 475b, 475c, 475d, 475e, 475f, 475g, and 475h).

In various embodiments, the plurality of power subsystems (470a, 470b, 470c, 470d, 470e, 470f, 470g, and 470h) can provide DC signals that can include positive DC voltages, negative DC voltages, or pulsed DC voltages, or any combination thereof. For example, the DC signals can vary from about −5000 V to about +5000 V. Alternatively, one or more of the power subsystems (470a, 470b, 470c, 470d, 470e, 470f, 470g, and 470h) may provide AC signals to the distribution subsystems (472a, 472b, 472c, 472d, 472e, 472f, 472g, and 472h) and the ring subsystem (475a, 475b, 475c, 475d, 475e, 475f, 475g, and 475h).

The fourth set of ring subsystems (475a, 475b, 475c, 475d, 475e, 475f, 475g, and 475h) can have an inner diameter ($d_{r1}$) and an outer diameter ($d_{r2}$). The inner diameter ($d_{r1}$) and the outer diameter ($d_{r2}$) can be dependent upon the size of the process chamber (FIG. 1, 110) and can vary from about 100 mm to about 500 mm. The gap thicknesses ($gt_1$) between the inner diameter ($d_{r1}$) and the outer diameter ($d_{r2}$) can be dependent upon the size of the chamber walls (FIG. 1, 112) and can vary from about 0.5 mm to about 5 mm. Alternatively, the fourth set of ring subsystems (475a, 475b, 475c, 475d, 475e, 475f, 475g, and 475h) may be configured differently.

In FIG. 4B, a side view 400b shows a side view of the fourth set of ring subsystems (475a, 475b, 475c, 475d, 475e, 475f, 475g, and 475h). Alternatively, the number of segments may be different. Each of the ring segments in the fourth set of ring subsystems (475a, 475b, 475c, 475d, 475e, 475f, 475g, and 475h) can have thicknesses ($t_{r1}$). The thickness ($t_{r1}$) can be dependent upon the size of the process chamber (FIG. 1, 110) and can vary from about 10 mm to about 50 mm. Alternatively, the segment thicknesses ($t_{r1}$) may be different. Each of the fourth set of ring subsystems (475a, 475b, 475c, 475d, 475e, 475f, 475g, and 475h) can have gap thicknesses ($g_{r1}$) associated therewith. The gap thicknesses ($g_{r1}$) can be dependent upon the size of the process chamber (FIG. 1, 110) and can vary from about 0.1 mm to about 5 mm. Alternatively, the gap thicknesses ($g_{r1}$) may be different.

FIGS. 5A-5B illustrate simplified views of a fifth exemplary power subsystem, a fifth exemplary distribution subsystem, and a fifth exemplary ring subsystem in accordance with embodiments of the invention.

In FIG. 5A, the top view 500a shows a fifth exemplary power subsystem 570 coupled to a fifth exemplary distribution subsystem 572 that is coupled to a fifth exemplary ring subsystem 575. As shown in FIG. 5A, the fifth ring subsystem 575 can be configured as a segmented cylindrical ring structure and can include can include metallic components, semiconductor components, dielectric components, switching elements, measuring elements, protection elements, isolation elements, combining elements, and/or separating elements. The fifth ring subsystem 575 can be coupled to a fifth distribution subsystem 572, and the fifth distribution subsystem 572 can be coupled to a fifth power subsystem 570. During operation, the fifth ring subsystem (575a, 575b, 575c, 575d, 575e, 575f, 575g, and 575h) can provide secondary electrons (571a, 571b, 571c, 571d, 571e, 571f, 571g, and 571h) to the space inside the segmented cylindrical ring structure of the ring subsystem (575a, 575b, 575c, 575d, 575e, 575f, 575g, and 575h).

The fifth ring system 500 can include a plurality of isolation elements (577a, 577b, 577c, 577d, 577e, 577f, 577g, and 577h) configured between the plurality of ring subsystem (575a, 575b, 575c, 575d, 575e, 575f, 575g, and 575h). The fifth set of isolation elements (577a, 577b, 577c, 577d, 577e, 577f, 577g, and 577h) can have thicknesses ($it_1$) and widths ($iw_2$). The thicknesses ($it_1$) and widths ($iw_2$) can be dependent upon the size of the process chamber (FIG. 1, 110) and can vary from about 0.01 mm to about 5 mm. For example, the fifth set of isolation elements (577a, 577b, 577c, 577d, 577e, 577f, 577g, and 577h) can be coupled to ground. Alternatively, one or more of the fifth set of isolation elements (577a, 577b, 577c, 577d, 577e, 577f, 577g, and 577h) may not be coupled to ground. During operation, some of the secondary electrons (571a, 571b, 571c, 571d, 571e, 571f, 571g, and 571h) can return to ground using one or more of the fifth set of isolation elements (577a, 577b, 577c, 577d, 577e, 577f, 577g, and 577h)).

In some embodiments, the fifth power subsystem 570 can provide DC signals to the fifth distribution subsystem 572 and the fifth ring subsystems (575a, 575b, 575c, 575d, 575e, 575f, 575g, and 575h). For example, the DC signals can include positive DC voltages, negative DC voltages, or pulsed DC voltages, or any combination thereof, and the DC signals can vary from about −5000 V to about +5000 V. Alternatively, the fifth power subsystem 570 can provide AC signals to the fifth distribution subsystem 572 and the fifth ring subsystems (575a, 575b, 575c, 575d, 575e, 575f, 575g, and 575h).

The fifth ring subsystem (575a, 575b, 575c, 575d, 575e, 575f, 575g, and 575h) can have an inner diameter ($d_{r1}$) and an outer diameter ($d_{r2}$). The inner diameter ($d_{r1}$) and the outer diameter ($d_{r2}$) can be dependent upon the size of the process chamber (FIG. 1, 110) and can vary from about 100 mm to about 500 mm. The gap thicknesses ($gt_1$) between the inner diameter ($d_{r1}$) and the outer diameter ($d_{r2}$) can be dependent upon the size of the chamber walls (FIG. 1, 112) and can vary from about 0.5 mm to about 5 mm. Alternatively, the fifth ring subsystem (575a, 575b, 575c, 575d, 575e, 575f, 575g, and 575h) may be configured differently.

In FIG. 5B, a side view 500b shows a side view of the fifth ring subsystems (575a, 575b, 575c, 575d, 575e, 575f, 575g, and 575h). Alternatively, the number of segments may be different. Each of the ring segments (575a, 575b, 575c, 575d, 575e, 575f, 575g, and 575h) can have thicknesses ($t_{r1}$). The thickness ($t_{r1}$) can be dependent upon the size of the process chamber (FIG. 1, 110) and can vary from about 10 mm to about 50 mm. Alternatively, the segment thicknesses ($t_{r1}$) may be different. Each of the ring segments (575a, 575b, 575c, 575d, 575e, 575f, 575g, and 575h) can have a gap thickness ($g_{r1}$) associated therewith. The gap thicknesses ($g_{r1}$) can be dependent upon the size of the process chamber (FIG. 1, 110) and can vary from about 0.1 mm to about 5 mm. Alternatively, the gap thicknesses ($g_{r1}$) may be different.

FIGS. 6A-6B illustrate simplified views of a sixth exemplary power system in accordance with embodiments of the invention. The sixth exemplary power system 600a includes a sixth exemplary power system 600a, a third exemplary distribution subsystem, and a third exemplary ring subsystem In FIG. 6A, the top view 600a shows a plurality of power subsystems (670a, 670b, 670c, 670d, 670e, 670f, 670g, and 670h) coupled to a plurality of distribution subsystems (672a, 672b, 672c, 672d, 672e, 672f, 672g, and 672h) that can be coupled to a pluarity of ring subsystems (675a, 675b, 675c, 675d, 675e, 675f, 675g, and 675h). For example, the ring subsystems (675a, 675b, 675c, 675d, 675e, 675f, 675g, and 675h) can be configured as a segmented cylindrical ring structure and can include can include metallic components, semiconductor components, dielectric components, switching elements, measuring elements, protection elements, isolation elements, combining elements, and/or separating elements.

A first power subsystem 670a can be coupled to a first distribution subsystem 672a that can be coupled to a first ring subsystem 675a. The first power subsystem 670a can provide first positive DC signals to the first distribution subsystem 672a and the first ring subsystem 675a. During operation, the first ring subsystem 675a can provide secondary electrons 671a to the space 615 inside the segmented cylindrical ring structure comprising the ring subsystems (675a, 675b, 675c, 675d, 675e, 675f, 675g, and 675h).

A second exemplary power subsystem 670b can be coupled to a second exemplary distribution subsystem 672b that can be coupled to a second exemplary ring subsystem 675b. The second power subsystem 670b can provide first negative DC signals to the second distribution subsystem 672b and the second ring subsystem 675b. During operation, the second ring subsystem 675b can provide a second set of secondary electrons 671b to the space 615 inside the segmented cylindrical ring structure comprising the ring subsystems (675a, 675b, 675c, 675d, 675e, 675f, 675g, and 675h).

A third exemplary power subsystem 670c can be coupled to a third exemplary distribution subsystem 672c that can be coupled to a third exemplary ring subsystem 675c. The third power subsystem 670c can provide second positive DC signals to the third distribution subsystem 672c and the third ring subsystem 675c. During operation, the third ring subsystem 675c can provide a third set of secondary electrons 671*c* to the space 615 inside the segmented cylindrical ring structure comprising the ring subsystems (675*a*, 675*b*, 675*c*, 675*d*, 675*e*, 675*f*, 675*g*, and 675*h*).

A fourth exemplary power subsystem 670*d* can be coupled to a fourth exemplary distribution subsystem 672*d* that can be coupled to a fourth exemplary ring subsystem 675*d*. The fourth power subsystem 670*d* can provide second negative DC signals to the fourth distribution subsystem 672*d* and the fourth ring subsystem 675*d*. During operation, the fourth ring subsystem 675*d* can provide a fourth set of secondary electrons 671*d* to the space 615 inside the segmented cylindrical ring structure comprising the ring subsystems (675*a*, 675*b*, 675*c*, 675*d*, 675*e*, 675*f*, 675*g*, and 675*h*).

A fifth exemplary power subsystem 670*e* can be coupled to a fifth exemplary distribution subsystem 672*e* that can be coupled to a fifth exemplary ring subsystem 675*e*. The fifth power subsystem 670*e* can provide third positive DC signals to the fifth distribution subsystem 672*e* and the fifth ring subsystem 675*e*. During operation, the fifth ring subsystem 675*e* can provide a fifth set of secondary electrons 671*e* to the space 615 inside the segmented cylindrical ring structure comprising the ring subsystems (675*a*, 675*b*, 675*c*, 675*d*, 675*e*, 675*f*, 675*g*, and 675*h*).

A sixth exemplary power subsystem 670*f* can be coupled to a sixth exemplary distribution subsystem 672*f* that can be coupled to a sixth exemplary ring subsystem 675*f*. The sixth power subsystem 670*f* can provide third negative DC signals to the sixth distribution subsystem 672*f* and the sixth ring subsystem 675*f*. During operation, the sixth ring subsystem 675*f* can provide a sixth set of secondary electrons 671*f* to the space 615 inside the segmented cylindrical ring structure comprising the ring subsystems (675*a*, 675*b*, 675*c*, 675*d*, 675*e*, 675*f*, 675*g*, and 675*h*).

A seventh exemplary power subsystem 670*g* can be coupled to a seventh exemplary distribution subsystem 672*g* that can be coupled to a seventh exemplary ring subsystem 675*g*. The seventh power subsystem 670*g* can provide fourth positive DC signals to the seventh distribution subsystem 672*g* and the seventh ring subsystem 675*g*. During operation, the seventh ring subsystem 675*g* can provide a seventh set of secondary electrons 671*g* to the space 615 inside the segmented cylindrical ring structure comprising the ring subsystems (675*a*, 675*b*, 675*c*, 675*d*, 675*e*, 675*f*, 675*g*, and 675*h*).

An eighth exemplary power subsystem 670*h* can be coupled to an eighth exemplary distribution subsystem 672*h* that can be coupled to an eighth exemplary ring subsystem 675*h*. The eighth power subsystem 670*h* can provide fourth negative DC signals to the eighth distribution subsystem 672*h* and the eighth ring subsystem 675*h*. During operation, the eighth ring subsystem 675*h* can provide an eighth set of secondary electrons 671*h* to the space 615 inside the segmented cylindrical ring structure comprising the ring subsystems (675*a*, 675*b*, 675*c*, 675*d*, 675*e*, 675*f*, 675*g*, and 675*h*).

In various embodiments, the plurality of power subsystems (670*a*, 670*b*, 670*c*, 670*d*, 670*e*, 670*f*, 670*g*, and 670*h*) can provide DC signals that can include positive DC voltages, negative DC voltages, or pulsed DC voltages, or any combination thereof. For example, the DC signals can vary from about −5000 V to about +5000 V. Alternatively, one or more of the power subsystems (670*a*, 670*b*, 670*c*, 670*d*, 670*e*, 670*f*, 670*g*, and 670*h*) may provide AC signals to the distribution subsystems (672*a*, 672*b*, 672*c*, 672*d*, 672*e*, 672*f*, 672*g*, and 672*h*) and the ring subsystem (675*a*, 675*b*, 675*c*, 675*d*, 675*e*, 675*f*, 675*g*, and 675*h*).

The fourth set of ring subsystems (675*a*, 675*b*, 675*c*, 675*d*, 675*e*, 675*f*, 675*g*, and 675*h*) can have an inner diameter ($d_{r1}$) and an outer diameter ($d_{r2}$). The inner diameter ($d_{r1}$) and the outer diameter ($d_{r2}$) can be dependent upon the size of the process chamber (FIG. 1, 110) and can vary from about 100 mm to about 500 mm. The gap thicknesses ($gt_1$) between the inner diameter ($d_{r1}$) and the outer diameter ($d_{r2}$) can be dependent upon the size of the chamber walls (FIG. 1, 112) and can vary from about 0.5 mm to about 5 mm. Alternatively, the fourth set of ring subsystems (675*a*, 675*b*, 675*c*, 675*d*, 675*e*, 675*f*, 675*g*, and 675*h*) may be configured differently.

In FIG. 6B, a side view 600*b* shows a side view of the fourth set of ring subsystems (675*a*, 675*b*, 675*c*, 675*d*, 675*e*, 675*f*, 675*g*, and 675*h*). Alternatively, the number of segments may be different. Each of the ring segments in the fourth set of ring subsystems (675*a*, 675*b*, 675*c*, 675*d*, 675*e*, 675*f*, 675*g*, and 675*h*) can have thicknesses ($t_{r1}$). The thickness ($t_{r1}$) can be dependent upon the size of the process chamber (FIG. 1, 110) and can vary from about 10 mm to about 50 mm. Alternatively, the segment thicknesses ($t_{r1}$) may be different. Each of the fourth set of ring subsystems (675*a*, 675*b*, 675*c*, 675*d*, 675*e*, 675*f*, 675*g*, and 675*h*) can have gap thicknesses ($g_{r1}$) associated therewith. The gap thicknesses ($g_{r1}$) can be dependent upon the size of the process chamber (FIG. 1, 110) and can vary from about 0.1 mm to about 5 mm. Alternatively, the gap thicknesses ($g_{r1}$) may be different.

Figures 7A, 7B:
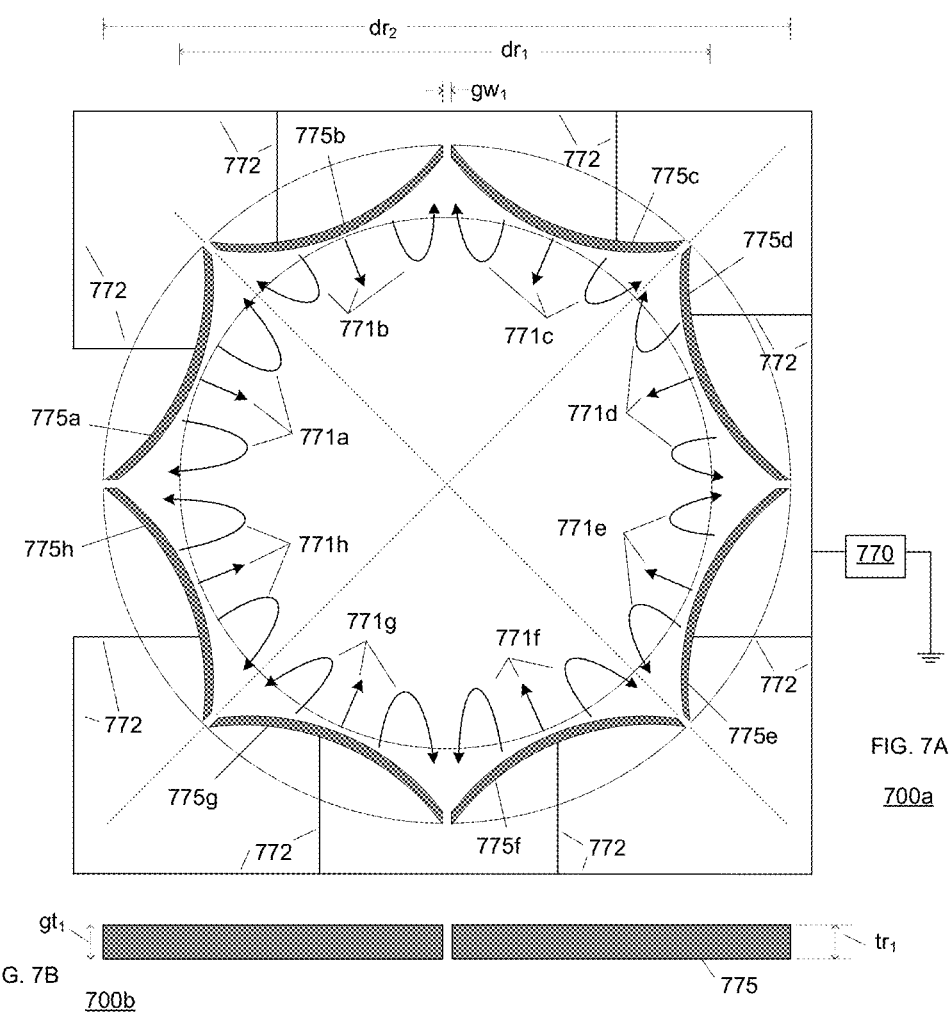
FIGS. 7A-7B illustrate simplified views of a seventh exemplary power subsystem, a seventh exemplary distribution subsystem, and a seventh exemplary ring subsystem in accordance with embodiments of the invention.

FIGS. 7A-7B illustrate simplified views of a seventh exemplary powered ring system in accordance with embodiments of the invention.

In FIG. 7A, the top view of the seventh exemplary powered ring system 700*a* shows a seventh exemplary power subsystem 770 coupled to a seventh exemplary distribution subsystem 772 that is coupled to a seventh set of exemplary ring subsystems (775*a*, 775*b*, 775*c*, 775*d*, 775*e*, 775*f*, 775*g*, and 775*h*) having convex shapes. As shown in FIG. 7A, the seventh set of exemplary ring subsystems (775*a*, 775*b*, 775*c*, 775*d*, 775*e*, 775*f*, 775*g*, and 775*h*) can be configured as a segmented cylindrical ring structure and can include can include metallic components, semiconductor components, dielectric components, switching elements, measuring elements, protection elements, isolation elements, combining elements, and/or separating elements. The seventh set of exemplary ring subsystems (775*a*, 775*b*, 775*c*, 775*d*, 775*e*, 775*f*, 775*g*, and 775*h*) can be coupled to a seventh distribution subsystem 772, and the seventh distribution subsystem 772 can be coupled to a seventh power subsystem 770. During operation, the seventh set of exemplary ring subsystems (775*a*, 775*b*, 775*c*, 775*d*, 775*e*, 775*f*, 775*g*, and 775*h*) can provide secondary electrons (771*a*, 771*b*, 771*c*, 771*d*, 771*e*, 771*f*, 771*g*, and 771*h*) to the space 715 inside the segmented cylindrical ring structure configured using the seventh set of exemplary ring subsystems (775*a*, 775*b*, 775*c*, 775*d*, 775*e*, 775*f*, 775*g*, and 775*h*).

In some embodiments, the seventh power subsystem 770 can provide DC signals to the seventh distribution subsystem 772 and the seventh set of ring subsystems (775*a*, 775*b*, 775*c*, 775*d*, 775*e*, 775*f*, 775*g*, and 775*h*). For example, the DC signals can include positive DC voltages, negative DC voltages, or pulsed DC voltages, or any combination thereof, and the DC signals can vary from about −5000 V to about +5000 V. Alternatively, the seventh power subsystem 770 can provide AC signals to the seventh distribution subsystem 772 and the seventh set of ring subsystems (775*a*, 775*b*, 775*c*, 775*d*, 775*e*, 775*f*, 775*g*, and 775*h*).

The seventh set of ring subsystems (775a, 775b, 775c, 775d, 775e, 775f, 775g, and 775h) can have an inner diameter ($d_{r1}$) and an outer diameter ($d_{r2}$). The inner diameter ($d_{r1}$) and the outer diameter ($d_{r2}$) can be dependent upon the size of the process chamber (FIG. 1, 110) and can vary from about 100 mm to about 500 mm. The difference between the inner diameter ($d_{r1}$) and the outer diameter ($d_{r2}$) can be dependent upon the size of the chamber walls (FIG. 1, 112) and can vary from about 5 mm to about 50 mm. Alternatively, the seventh set of ring subsystems (775a, 775b, 775c, 775d, 775e, 775f, 775g, and 775h) may be configured differently.

In FIG. 7B, a side view 700b shows a side view of the seventh set of ring subsystems (775a, 775b, 775c, 775d, 775e, 775f, 775g, and 775h). Alternatively, the number of segments may be different. Each of the seventh set of ring subsystems (775a, 775b, 775c, 775d, 775e, 775f, 775g, and 775h) can have segment thicknesses ($t_{r1}$). The segment thicknesses ($t_{r1}$) can be dependent upon the size of the process chamber (FIG. 1, 110) and can vary from about 10 mm to about 50 mm. Alternatively, the segment thicknesses ($t_{r1}$) may be different. Each of the seventh set of ring subsystems (775a, 775b, 775c, 775d, 775e, 775f, 775g, and 775h) can have a gap thickness ($g_{r1}$) associated therewith. The gap thicknesses ($g_{r1}$) can be dependent upon the size of the process chamber (FIG. 1, 110) and can vary from about 0.1 mm to about 5 mm. Alternatively, the gap thicknesses ($g_{r1}$) may be different.

FIG. 8A illustrates a bottom view of an EM wave launcher in accordance with embodiments of the invention, and FIG. 8B illustrates a schematic cross-sectional view of a portion of the EM wave launcher depicted in FIG. 8A. FIG. 8A illustrates a bottom view of an exemplary EM wave launcher 832, and a plurality of slots (848 and 849) in the slotted antenna 846 are illustrated as if one can see through resonator plate 850 to the slotted antenna 846. As shown in FIG. 8A, the plurality of slots (848 and 849) can be arranged in pairs, and each of the pair of slots comprises a first slot oriented orthogonal to a second slot. However, the orientation of slots in the plurality of slots (848 and 849) can be arbitrary. For example, the orientation of slots in the plurality of slots (848 and 849) can be according to a predetermined pattern for plasma uniformity and/or plasma stability.

On a planar surface 861 of resonator plate 850, first recesses 855 and second recesses 865 may be formed. In some embodiments, the first recesses 855 can be either aligned or partly aligned with the first slots 848 in the slotted antenna 846 or not aligned with the first slots 848 in the slotted antenna 846. For example, one or more of the first recesses 855 can be either aligned or partly aligned with a first slot 848 in the slotted antenna 846. In addition, one or more of the second recesses 865 can be aligned with one or more of second slots 849 in the slotted antenna 846.

In some embodiments, when one or more of the first recesses 855 are not aligned with one or more of the first slots 848, the second recesses 865 can be used to control the plasma generation and plasma stability. For example, when optical monitoring is used, uniform plasma can be measured across a range of powers coupled to the EM wave launcher 832 and a range of pressures in the process space (115, FIG. 1), and uniform plasma can be formed adjacent the plasma-facing surface 860. Further, the optical monitoring has shown that the variability of the first recesses 855 can contribute to plasma generation, plasma uniformity, and plasma stability for a wide range of the DC voltages, microwave power, and/or chamber pressure.

In other embodiments, when one or more of the second recesses 865 are aligned with one or more of second slots 849 in the slotted antenna 846, stable plasma can be established at low power levels. Plasma can be formed via ionization proximate these (larger) dimples, and flows from the second recesses 865 to the first recesses 855 (i.e., not aligned/partly aligned with the first slots 848). As a result, the plasma formed proximate these second recesses 865 is stable over a wide range of power and pressure, as the first recesses 855 can receive an "overflow" of plasma from the second recesses 865 and compensate for fluctuations in the plasma generation proximate the second recesses 865.

For improved control of plasma uniformity, the inventors believe that the regions adjacent the planar surface 861 should be controlled so that the risk for development of a mode-pattern is reduced. Therefore, as illustrated in FIG. 8A and FIG. 8B, the optimal placement of the first recesses 855 and the second recesses 865 may be such that a relatively large number of first recesses 855 are not aligned with the plurality of first slots 848 in slotted antenna 846, and a relatively large number of the second recesses 865 are aligned with the plurality of second slots 849. Although, the arrangement of recesses (855 and 865) may be chosen to achieve plasma uniformity, it may also be desirable to achieve non-uniform plasma that cooperates with the DC subsystem (170, FIG. 1) and/or other process parameters to achieve a uniform process at a surface of a substrate (105, FIG. 1) being processed by the plasma in the process space (115, FIG. 1).

Referring still to FIG. 8A and FIG. 8B, an exemplary EM wave launcher 832 is illustrated that can include a resonator plate 850 with plasma-facing surface 860. The EM wave launcher 832 further comprises a slotted antenna 846 having a plurality of first slots 848 and a plurality of second slots 849. The first slots 848 and the second slots 849 permit the coupling of EM energy from a first region above the slotted antenna 846 to a second region below the slotted antenna 846 wherein the resonator plate 850 is located.

The number, geometry, size, and distribution of the first slots 848 and second slots 849 can be factors that can contribute to the spatial uniformity and stability of the plasma formed in the process space (115, FIG. 1), and the design of the slotted antenna 846 may be used to control the spatial uniformity and stability of the plasmas in the process space (115, FIG. 1).

In various embodiments, the first recesses 855 can comprise a unique indentation or dimple formed within the plasma-facing surface 860. For example, a first recess 855 can comprise a cylindrical geometry, a spherical geometry, an aspherical geometry, a rectangular geometry, or any arbitrary shape. The first recess 855 can be characterized by a first depth 856 and a first diameter 857.

In addition, each of the second recesses 865 can include a unique indentation or dimple formed within the plasma-facing surface 860. For example, a second recess 865 can comprise a cylindrical geometry, a spherical geometry, an aspherical geometry, a rectangular geometry, or any arbitrary shape. The second recess 865 can be characterized by a second depth 866 and a second diameter 867. The dimensions of the first recesses 855 may or may not be the same as the dimensions of the second recesses 865. For instance, the first recesses 855 can be smaller than the second recesses 865.

Still referring to FIG. 8A and FIG. 8B, the resonator plate 850 can comprise a dielectric plate having a plate thickness 851 and a plate diameter 852. For example, the plasma-facing surface 860 on resonator plate 850 can comprise a planar surface 861 within which the first recesses 855 and the second recesses 865 can be formed. Alternatively, the resonator plate 850 may comprise an arbitrary geometry that can include concave, and/or convex surfaces.

The propagation of EM energy in the resonator plate 850 may be characterized by an effective wavelength (λ) for a given frequency of EM energy and dielectric constant for the resonator plate 850. The plate thickness 851 may be an integer number of quarter wavelengths (nλ/4), where n is an integer greater than zero) or an integer number of half wavelengths (mλ/2), where m is an integer greater than zero). For instance, the plate thickness 851 may be about a half wavelength thick (λ/2) or greater than about half the effective wavelength (>λ/2). Alternatively, the plate thickness 851 may range from about 25 mm (millimeters) to about 45 mm.

As an example, the first recesses 855 can be configured as cylindrical recesses, with first depths 856 and first diameters 857, and the first recesses can be located near an inner region of the plasma-facing surface 860.

The first diameter 867 may be an integer number of quarter wavelengths (n λ/4, where n is an integer greater than zero) or an integer number of half wavelengths (mλ/2, where m is an integer greater than zero). Additionally, a first difference 853 between the plate thickness 851 and the first depth 856 may be an integer number of quarter wavelengths (nλ/4, where n is an integer greater than zero) or an integer number of half wavelengths (mλ/2, where m is an integer greater than zero). For instance, the first diameter 857 may be about half the effective wavelength (λ/2), and a first difference 853 between the plate thickness 851 and the first depth 856 may be about half the effective wavelength (λ/2) or about quarter the effective wavelength (λ/4). The plate thickness 851 may be about half the effective wavelength (λ/2) or greater than half the effective wavelength (>λ/2).

Alternatively, the first diameter 857 may range from about 25 mm to about 35 mm, and the first difference 853 between the plate thickness 851 and the first depth 856 may range from about 10 mm to about 35 mm. Alternatively yet, the first diameter may range from about 30 mm to about 35 mm, and the first difference may range from about 10 mm to about 20 mm.

In the first recesses 855, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 860. For example, the surface radius may range from about 1 mm to about 3 mm.

In addition, the second recesses 865 can also be configured as cylindrical recesses with a second depth 866 and a second diameter 867, and the second recesses can be located near an outer region of the plasma-facing surface 860.

The second diameter 867 can be an integer number of quarter wavelengths (nλ/4, where n is an integer greater than zero) or an integer number of half wavelengths (mλ/2, where m is an integer greater than zero). Additionally, a second difference 863 between the plate thickness 851 and the second depth 866 may be an integer number of quarter wavelengths (nλ/4, where n is an integer greater than zero) or an integer number of half wavelengths (mλ/2, where m is an integer greater than zero). For instance, the second diameter 867 may be about half the effective wavelength (λ/2), and a second difference 863 between the plate thickness 851 and the second depth 866 may be about half the effective wavelength (λ/2) or about quarter the effective wavelength (λ/4).

Alternatively, the second diameter 867 may range from about 25 mm (millimeters) to about 35 mm, and the second difference 863 between the plate thickness 851 and the second depth 866 may range from about 10 mm to about 35 mm. Alternatively yet, the second diameter may range from about 30 mm to about 35 mm, and the second difference may range from about 10 mm to about 20 mm.

In the second recesses 865, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 860. For example, the surface radius may range from about 1 mm to about 3 mm.

FIG. 9A illustrates a bottom view of an EM wave launcher in accordance with embodiments of the invention, and FIG. 9B illustrates a schematic cross-sectional view of a portion of the EM wave launcher depicted in FIG. 9A. FIG. 9A illustrates a bottom view of an exemplary EM wave launcher 932, and a plurality of slots (948 and 949) in the slotted antenna 946 are illustrated as if one can see through resonator plate 950 to the slotted antenna 946. As shown in FIG. 9A, the plurality of slots (948 and 949) can be arranged in pairs, and each of the pair of slots comprises a first slot oriented orthogonal to a second slot. However, the orientation of slots in the plurality of slots (948 and 949) can be arbitrary. For example, the orientation of slots in the plurality of slots (948 and 949) can be according to a pre-determined pattern for plasma uniformity and/or plasma stability.

In some embodiments, a plurality of first recesses 955 can be configured in the resonator plate 950 and one or more of the first recesses 955 are not aligned with one or more of the first slots 948 in the slotted antenna 946. Alternatively, one or more of the first recesses 955 may not be aligned with the first slots 948 in the slotted antenna 946. In addition, a shelf recess 965 can be configured in the resonator plate 950, and the shelf recess 965 can comprise an arbitrary geometry including, for example, a cylindrical geometry, a spherical geometry, an aspherical geometry, a rectangular geometry, or any arbitrary shape. The shelf recess 965 can include a shelf depth 966 and a shelf width 967.

Referring still to FIG. 9A and FIG. 9B, an exemplary EM wave launcher 932 is illustrated that can include a resonator plate 950 with plasma-facing surface 960. The EM wave launcher 932 further comprises a slotted antenna 946 having a plurality of first slots 948 and a plurality of second slots 949. The first slots 948 and the second slots 949 permit the coupling of EM energy from a first region above the slotted antenna 946 to a second region below the slotted antenna wherein the resonator plate 950 is located.

The number, geometry, size, and distribution of the first slots 948 and second slots 949 can be factors that can contribute to the spatial uniformity and stability of the plasma formed in process space (115, FIG. 1), and the design of the slotted antenna 946 can be used to control the spatial uniformity and stability of the plasmas in the process space (115, FIG. 1).

In various embodiments, the first recesses 955 can comprise a unique indentation or dimple formed within the plasma-facing surface 960. For example, a first recess 955 can comprise a cylindrical geometry, a spherical geometry, an aspherical geometry, a rectangular geometry, or any arbitrary shape. The first recess 955 can be characterized by a first depth 956 and a first diameter 957.

In addition, the shelf recess 965 can include a unique indentation or dimple formed within the plasma-facing surface 960. For example, a shelf recess 965 can comprise a cylindrical geometry, a spherical geometry, an aspherical geometry, a rectangular geometry, or any arbitrary shape.

Still referring to FIG. 9A and FIG. 9B, the resonator plate 950 comprises a dielectric plate having a plate thickness 951 and a plate diameter 952. For example, the plasma-facing surface 960 on resonator plate 950 can comprise a planar surface 961 within which the first recesses 955 and the shelf recess 965 can be formed. Alternatively, the resonator plate 950 may comprise an arbitrary geometry that can include concave, and/or convex surfaces.

The propagation of EM energy in the resonator plate 950 may be characterized by an effective wavelength ($\lambda$) for a given frequency of EM energy and dielectric constant for the resonator plate 950. The plate thickness 951 may be an integer number of quarter wavelengths (n$\lambda$/4, where n is an integer greater than zero) or an integer number of half wavelengths (m$\lambda$/2, where m is an integer greater than zero). For instance, the plate thickness 951 may be about a half wavelength thick ($\lambda$/2) or greater than about half the effective wavelength (>$\lambda$/2). Alternatively, the plate thickness 951 may range from about 25 mm (millimeters) to about 45 mm.

As an example, the first recesses 955 can be configured as cylindrical recesses, with first depths 956 and first diameters 957, and the first recesses can be located near an inner region of the plasma-facing surface 960.

The first diameter 957 may be an integer number of quarter wavelengths (n$\lambda$/4, where n is an integer greater than zero) or an integer number of half wavelengths (m$\lambda$/2, where m is an integer greater than zero). Additionally, a first difference 953 between the plate thickness 951 and the first depth 956 may be an integer number of quarter wavelengths (n$\lambda$/4, where n is an integer greater than zero) or an integer number of half wavelengths (m$\lambda$/2, where m is an integer greater than zero). For instance, the first diameter 957 may be about half the effective wavelength ($\lambda$/2), and a first difference 953 between the plate thickness 951 and the first depth 956 may be about half the effective wavelength ($\lambda$/2) or about quarter the effective wavelength ($\lambda$/4). The plate thickness 951 may be about half the effective wavelength ($\lambda$/2) or greater than half the effective wavelength (>$\lambda$/2).

Alternatively, the first diameter 957 may range from about 25 mm to about 35 mm, and the first difference 953 between the plate thickness 951 and the first depth 956 may range from about 10 mm to about 35 mm. Alternatively yet, the first diameter may range from about 30 mm to about 35 mm, and the first difference may range from about 10 mm to about 20 mm.

In the first recesses 955, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 960. For example, the surface radius may range from about 1 mm to about 3 mm.

In addition, the shelf recess 965 can be configured as cylindrical ring with a shelf depth 966 and a shelf width 967, and the shelf recess can be located near an outer region of the plasma-facing surface 960.

The shelf width 967 may be an integer number of quarter wavelengths (n$\lambda$/4, where n is an integer greater than zero) or an integer number of half wavelengths (m$\lambda$/2, where m is an integer greater than zero). Additionally, a second difference 963 between the plate thickness 951 and the shelf depth 966 may be an number of quarter wavelengths (n$\lambda$/4, where n is an integer greater than zero) or an integer number of half wavelengths (m$\lambda$/2, where m is an integer greater than zero). For instance, the shelf width 967 may be about half the effective wavelength ($\lambda$/2), and a second difference 963 between the plate thickness 951 and the shelf depth 966 may be about half the effective wavelength ($\lambda$/2) or about quarter the effective wavelength ($\lambda$/4).

Alternatively, the shelf width 967 may range from about 25 mm (millimeters) to about 35 mm, and the second difference 963 between the plate thickness 951 and the shelf depth 966 may range from about 10 mm to about 35 mm. Alternatively yet, the shelf width may range from about 30 mm to about 35 mm, and the second difference may range from about 10 mm to about 20 mm.

In the shelf recess 965, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 960. For example, the surface radius may range from about 1 mm to about 3 mm.

Figures 10A, 10B:
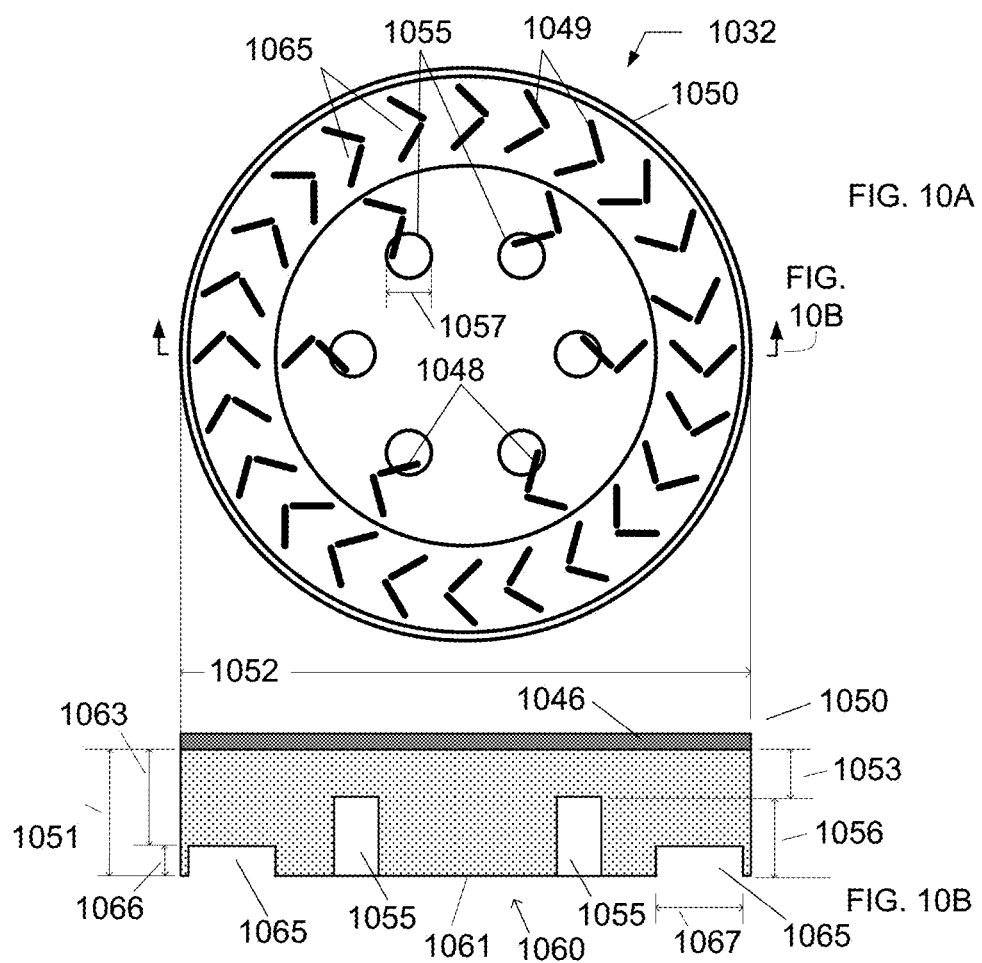
FIGS. 10A and 10B illustrate exemplary views of a third EM wave launcher in accordance with embodiments.

FIG. 10A illustrates a bottom view of an EM wave launcher in accordance with embodiments of the invention, and FIG. 10B illustrates a schematic cross-sectional view of a portion of the EM wave launcher depicted in FIG. 10A. FIG. 10A illustrates a bottom view of an exemplary EM wave launcher 1032, and a plurality of slots (1048 and 1049) in the slotted antenna 1046 are illustrated as if one can see through resonator plate 1050 to the slotted antenna 1046. As shown in FIG. 10A, the plurality of slots (1048 and 1049) can be arranged in pairs, and each of the pair of slots comprises a first slot oriented orthogonal to a second slot. However, the orientation of slots in the plurality of slots (1048 and 1049) can be arbitrary. For example, the orientation of slots in the plurality of slots (1048 and 1049) can be according to a pre-determined pattern for plasma uniformity and/or plasma stability.

In some embodiments, a plurality of first recesses 1055 can be configured in the resonator plate 1050 and one or more of the first recesses 1055 can be substantially aligned with the first slots 1048 in the slotted antenna 1046. Alternatively, one or more of the first recesses 1055 may not be aligned with one or more of the first slots 1048 in the slotted antenna 1046. In addition, a shelf recess 1065 can be configured in the resonator plate 1050, and the shelf recess 1065 can comprise an arbitrary geometry including, for example, a cylindrical geometry, a spherical geometry, an aspherical geometry, a rectangular geometry, or any arbitrary shape. The shelf recess 1065 can include a shelf depth 1066 and a shelf width 1067. For example, the shelf recess 1065 can be substantially aligned with the plurality of second 1049. Alternatively, the shelf recess 1065 may be aligned, partly aligned, or not aligned with the plurality of second slots 1049.

Referring still to FIG. 10A and FIG. 10B, an exemplary EM wave launcher 1032 is illustrated that can include a resonator plate 1050 with plasma-facing surface 1060. The EM wave launcher 1032 further comprises a slotted antenna 1046 having a plurality of first slots 1048 and a plurality of second slots 1049. The first slots 1048 and the second slots 1049 permit the coupling of EM energy from a first region above the slotted antenna 1046 to a second region below the slotted antenna wherein the resonator plate 1050 is located.

The number, geometry, size, and distribution of the first slots 1048 and second slots 1049 can be factors that can contribute to the spatial uniformity and stability of the plasma formed in process space (115, FIG. 1), and the design of the slotted antenna 1046 may be used to control the spatial uniformity and stability of the plasmas in the process space (115, FIG. 1).

In various embodiments, the first recesses 1055 can comprise a unique indentation or dimple formed within the plasma-facing surface 1060. For example, a first recess 1055 can comprise a cylindrical geometry, a spherical geometry, an aspherical geometry, a rectangular geometry, or any arbitrary shape. The first recess 1055 can be characterized by a first depth 1056 and a first diameter 1057.

In addition, the shelf recess 1065 can include a unique indentation or dimple formed within the plasma-facing surface 1060. For example, a shelf recess 1065 can comprise a cylindrical geometry, a spherical geometry, an aspherical geometry, a rectangular geometry, or any arbitrary shape.

Still referring to FIG. 10A and FIG. 10B, the resonator plate 1050 comprises a dielectric plate having a plate thickness 1051 and a plate diameter 1052. For example, the plasma-facing surface 1060 on resonator plate 1050 can comprise a planar surface 1061 within which the first recesses 1055 and the shelf recess 1065 can be formed. Alternatively, the resonator plate 1050 may comprise an arbitrary geometry that can include concave, and/or convex surfaces.

The propagation of EM energy in the resonator plate 1050 may be characterized by an effective wavelength ($\lambda$) for a given frequency of EM energy and dielectric constant for the resonator plate 1050. The plate thickness 1051 may be an integer number of quarter wavelengths ($n\lambda/4$, where n is an integer greater than zero) or an integer number of half wavelengths ($m\lambda/2$, where m is an integer greater than zero). For instance, the plate thickness 1051 may be about a half wavelength ($\lambda/2$) or greater than about half the effective wavelength ($>\lambda/2$). Alternatively, the plate thickness 1051 may range from about 25 mm (millimeters) to about 45 mm.

As an example, the first recesses 1055 can be configured as cylindrical recesses, with first depths 1056 and first diameters 1057, and the first recesses can be located near an inner region of the plasma-facing surface 1060.

The first diameter 1057 may be an integer number of quarter wavelengths ($n\lambda/4$, where n is an integer greater than zero) or an integer number of half wavelengths ($m\lambda/2$, where m is an integer greater than zero). Additionally, a first difference 1053 between the plate thickness 1051 and the first depth 1056 may be an integer number of quarter wavelengths ($n\lambda/4$, where n is an integer greater than zero) or an integer number of half wavelengths ($m\lambda/2$, where m is an integer greater than zero). For instance, the first diameter 1057 may be about half the effective wavelength ($\lambda/2$), and a first difference 1053 between the plate thickness 1051 and the first depth 1056 may be about half the effective wavelength ($\lambda/2$) or about quarter the effective wavelength ($\lambda/4$). The plate thickness 1051 may be about half the effective wavelength ($\lambda/2$) or greater than half the effective wavelength ($>\lambda/2$).

Alternatively, the first diameter 1057 may range from about 25 mm to about 35 mm, and the first difference 1053 between the plate thickness 1051 and the first depth 1056 may range from about 10 mm to about 35 mm. Alternatively yet, the first diameter may range from about 30 mm to about 35 mm, and the first difference may range from about 10 mm to about 20 mm.

In the first recesses 1055, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 360. For example, the surface radius may range from about 1 mm to about 3 mm.

In addition, the shelf recess 1065 can be configured as cylindrical ring with a shelf depth 1066 and a shelf width 1067, and the shelf recess can be located near an outer region of the plasma-facing surface 1060.

The shelf width 1067 may be an integer number of quarter wavelengths ($n\lambda/4$, where n is an integer greater than zero) or an integer number of half wavelengths ($m\lambda/2$, where m is an integer greater than zero). Additionally, a second difference 1063 between the plate thickness 1051 and the shelf depth 1066 may be an integer number of quarter wavelengths ($n\lambda/4$, where n is an integer greater than zero) or an integer number of half wavelengths ($m\lambda/2$, where m is an integer greater than zero). For instance, the shelf width 1067 may be about half the effective wavelength ($\lambda/2$), and a second difference 1063 between the plate thickness 1051 and the shelf depth 1066 may be about half the effective wavelength ($\lambda/2$) or about quarter the effective wavelength ($\lambda/4$).

Alternatively, the shelf width 1067 may range from about 25 mm (millimeters) to about 35 mm, and the second difference 1063 between the plate thickness 1051 and the shelf depth 1066 may range from about 10 mm to about 35 mm. Alternatively yet, the shelf width may range from about 30 mm to about 35 mm, and the second difference may range from about 10 mm to about 20 mm.

In the shelf recess 1065, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1060. For example, the surface radius may range from about 1 mm to about 3 mm.

FIG. 11A illustrates a bottom view of an EM wave launcher in accordance with embodiments of the invention, and FIG. 11B illustrates a schematic cross-sectional view of a portion of the EM wave launcher depicted in FIG. 11A. FIG. 11A illustrates a bottom view of an exemplary EM wave launcher 1132, and a plurality of slots (1148 and 1149) in the slotted antenna 1146 are illustrated as if one can see through resonator plate 1150 to the slotted antenna 1146. As shown in FIG. 11A, the plurality of slots (1148 and 1149) can be arranged in pairs, and each of the pair of slots comprises a first slot oriented orthogonal to a second slot. However, the orientation of slots in the plurality of slots (1148 and 1149) can be arbitrary. For example, the orientation of slots in the plurality of slots (1148 and 1149) can be according to a pre-determined pattern for plasma uniformity and/or plasma stability.

In some embodiments, a plurality of first recesses 1155 can be configured in the resonator plate 1150 and one or more of the first recesses 1155 can be substantially non-aligned with the first slots 1148 in the slotted antenna 1146. Alternatively, one or more of the first recesses 1155 may be aligned or partially aligned with one or more of the first slots 1148 in the slotted antenna 1146. In addition, a slot recess 1165 can be configured in the resonator plate 1150, and the slot recess 1165 can comprise an arbitrary geometry including, for example, a cylindrical geometry, a spherical geometry, an aspherical geometry, a rectangular geometry, or any arbitrary shape. The slot recess 1165 can include a slot depth 1166 and a slot width 1167. For example, the slot recess 1165 can be substantially aligned with the plurality of second slots 1149. Alternatively, the slot recess 1165 may be either aligned, partly aligned, or not aligned with the plurality of second slots 1149. Furthermore, a plurality of second recesses 1175 can be configured in the slot recess 1165, and the second recesses 1175 can comprise an arbitrary geometry including, for example, a cylindrical geometry, a spherical geometry, an aspherical geometry, a rectangular geometry, or any arbitrary shape. The second recesses 1175 can include a second depths 1176 and second widths 1177. For example, the second recesses 1175 can be substantially aligned with the plurality of second slots 1149. Alternatively, the second recesses 1175 may be either aligned, partly aligned, or not aligned with the plurality of second slots 1149.

Referring still to FIG. 11A and FIG. 11B, an exemplary EM wave launcher 1132 is illustrated that can include a resonator plate 1150 with plasma-facing surface 1160. The EM wave launcher 1132 further comprises a slotted antenna 1146 having a plurality of first slots 1148 and a plurality of second slots 1149. The first slots 1148 and the second slots 1149 permit the coupling of EM energy from a first region above the slotted antenna 1146 to a second region below the slotted antenna wherein the resonator plate 1150 is located.

The number, geometry, size, and distribution of the first slots 1148 and second slots 1149 can be factors that can contribute to the spatial uniformity and stability of the plasma formed in process space (115, FIG. 1), and the design of the slotted antenna 1146 may be used to control the spatial uniformity and stability of the plasmas in the process space (115, FIG. 1).

In various embodiments, the first recesses 1155 and the second recesses 1175 can comprise a unique indentation or dimple formed within the plasma-facing surface 1160. For example, a first recess 1155 or a second recess 1175 can comprise a cylindrical geometry, a spherical geometry, an aspherical geometry, a rectangular geometry, or any arbitrary shape. The first recess 1155 can be characterized by a first depth 1156 and a first diameter 1157. The second recess 1175 can be characterized by a second depth 1176 and a second diameter 1177.

In addition, the slot recess 1165 can include a unique indentation or dimple formed within the plasma-facing surface 1160. For example, a slot recess 1165 can comprise a cylindrical geometry, a spherical geometry, an aspherical geometry, a rectangular geometry, or any arbitrary shape.

Still referring to FIG. 11A and FIG. 11B, the resonator plate 1150 comprises a dielectric plate having a plate thickness 1151 and a plate diameter 1152. For example, the plasma-facing surface 1160 on resonator plate 1150 can comprise a planar surface 1161 within which the first recesses 1155 and the slot recess 1165 can be formed. Alternatively, the resonator plate 1150 may comprise an arbitrary geometry that can include concave, and/or convex surfaces.

The propagation of EM energy in the resonator plate 1150 may be characterized by an effective wavelength ($\lambda$) for a given frequency of EM energy and dielectric constant for the resonator plate 1150. The plate thickness 1151 may be an integer number of quarter wavelengths ($n\lambda/4$), where n is an integer greater than zero) or an integer number of half wavelengths ($m\lambda/2$), where m is an integer greater than zero). For instance, the plate thickness 1151 may be about a half wavelength thick ($\lambda/2$) or greater than about half the effective wavelength ($>\lambda/2$). Alternatively, the plate thickness 1151 may range from about 25 mm (millimeters) to about 45 mm.

As an example, the first recesses 1155 can be configured as cylindrical recesses, with first depths 1156 and first diameters 1157, and the first recesses can be located near an inner region of the plasma-facing surface 1160. In addition, the second recesses 1175 can be configured as cylindrical recesses, with second depths 1176 and second diameters 1177, and the second recesses 1175 can be located near an outer region of the plasma-facing surface 1160.

The first diameter 1157 and the second diameter 1177 can be an integer number of quarter wavelengths ($n\lambda/4$), where n is an integer greater than zero) or an integer number of half wavelengths ($m\lambda/2$), where m is an integer greater than zero). Additionally, a first difference 1153 between the plate thickness 1151 and the first depth 1156 may be an integer number of quarter wavelengths ($n\lambda/4$), where n is an integer greater than zero) or an integer number of half wavelengths ($m\lambda/2$), where m is an integer greater than zero). For instance, the first diameter 1157 and the second diameter 1177 can be about one half the effective wavelength ($\lambda/2$), and a first difference 1153 between the plate thickness 1151 and the first depth 1156 may be about half the effective wavelength ($\lambda/2$) or about quarter the effective wavelength ($\lambda/4$). The plate thickness 1151 may be about half the effective wavelength ($\lambda/2$) or greater than half the effective wavelength ($>\lambda/2$).

Alternatively, the first diameter 1157 may range from about 25 mm to about 35 mm, and the first difference 1153 between the plate thickness 1151 and the first depth 1156 may range from about 10 mm to about 35 mm. Alternatively yet, the first diameter may range from about 30 mm to about 35 mm, and the first difference may range from about 10 mm to about 20 mm.

In the first recesses 1155 and the second recesses 1175, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 360. For example, the surface radius may range from about 1 mm to about 3 mm.

In addition, the slot recess 1165 can be configured as cylindrical ring with a slot depth 1166 and a slot width 1167, and the slot recess can be located near an outer region of the plasma-facing surface 1160.

The slot width 1167 may be an integer number of quarter wavelengths ($n\lambda/4$), where n is an integer greater than zero) or an integer number of half wavelengths ($m\lambda/2$), where m is an integer greater than zero). Additionally, a second difference 1163 between the plate thickness 1151 and the slot depth 1166 may be an integer number of quarter wavelengths (nλ/4), where n is an integer greater than zero) or an integer number of half wavelengths (mλ/2), where m is an integer greater than zero). For instance, the slot width 1167 may be about half the effective wavelength (λ/2), and a second difference 1163 between the plate thickness 1151 and the slot depth 1166 may be about half the effective wavelength (λ/2) or about quarter the effective wavelength (λ/4).

Alternatively, the slot width 1167 may range from about 25 mm (millimeters) to about 35 mm, and the second difference 1163 between the plate thickness 1151 and the slot depth 1166 may range from about 10 mm to about 35 mm. Alternatively yet, the slot width may range from about 30 mm to about 35 mm, and the second difference may range from about 10 mm to about 20 mm.

In the slot recess 1165, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1160. For example, the surface radius may range from about 1 mm to about 3 mm.

FIG. 12A illustrates a bottom view of an EM wave launcher in accordance with embodiments of the invention, and FIG. 12B illustrates a schematic cross-sectional view of a portion of the EM wave launcher depicted in FIG. 12A. FIG. 12A illustrates a bottom view of an exemplary EM wave launcher 1232, and a plurality of slots (1248 and 1249) in the slotted antenna 1246 are illustrated as if one can see through resonator plate 1250 to the slotted antenna 1246. As shown in FIG. 12A, the plurality of slots (1248 and 1249) can be arranged in pairs, and each of the pair of slots comprises a first slot oriented orthogonal to a second slot. However, the orientation of slots in the plurality of slots (1248 and 1249) can be arbitrary. For example, the orientation of slots in the plurality of slots (1248 and 1249) can be according to a pre-determined pattern for plasma uniformity and/or plasma stability.

In some embodiments, a plurality of first recesses 1255 can be configured in the resonator plate 1250 and one or more of the first recesses 1255 can be substantially non-aligned with the first slots 1248 in the slotted antenna 1246. Alternatively, one or more of the first recesses 1255 may be aligned or partially aligned with one or more of the first slots 1248 in the slotted antenna 1246. In addition, a channel recess 1265 can be configured in the resonator plate 1250, and the channel recess 1265 can comprise an arbitrary geometry including, for example, a cylindrical geometry, a spherical geometry, an aspherical geometry, a rectangular geometry, or any arbitrary shape. The channel recess 1265 can include a channel depth 1266 and a channel width 1267. For example, the channel recess 1265 can be substantially aligned with the plurality of second slots 1249. Alternatively, the channel recess 1265 may be either aligned, partly aligned, or not aligned with the plurality of second slots 1249.

In some embodiments, opening 1290 can include an opening depth 1291 and an opening width 1292, and the gas passage 1295 can include a passage length 1296 and a passage width 1297. For example, the opening 1290 and the gas passage 1295 can be substantially aligned with the center of the resonator plate 1250. Alternatively, the opening 1290 and the gas passage 1295 may be aligned differently.

Referring still to FIG. 12A and FIG. 12B, an exemplary EM wave launcher 1232 is illustrated that can include a resonator plate 1250 with plasma-facing surface 1260. The EM wave launcher 1232 further comprises a slotted antenna 1246 having a plurality of first slots 1248 and a plurality of second slots 1249. The first slots 1248 and the second slots 1249 permit the coupling of EM energy from a first region above the slotted antenna 1246 to a second region below the slotted antenna wherein the resonator plate 1250 is located.

The number, geometry, size, and distribution of the first slots 1248 and second slots 1249 can be factors that can contribute to the spatial uniformity and stability of the plasma formed in the process space (115, FIG. 1). Thus, the design of the slotted antenna 1246 may be used to control the spatial uniformity and stability of the DC/SWP plasmas in the process space (115, FIG. 1).

In various embodiments, the first recesses 1255 and the second recesses 1265 can comprise a unique indentation or dimple formed within the plasma-facing surface 1260. For example, a first recess 1255 can comprise a cylindrical geometry, a spherical geometry, an aspherical geometry, a rectangular geometry, or any arbitrary shape. The first recess 1255 can be characterized by a first depth 1256 and a first diameter 1257.

In addition, the second recess 1265 can comprise a channel having a trapezoidal or frusto-triangular cross-section. However, the channel in the second recess 1265 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The second recess 1265 may comprise a channel depth 1266, a first channel width 1266, and a second channel width 1268.

Still referring to FIG. 12A and FIG. 12B, the resonator plate 1250 comprises a dielectric plate having a plate thickness 1251 and a plate diameter 1252. For example, the plasma-facing surface 1260 on resonator plate 1250 can comprise a planar surface 1261 within which the first recesses 1255 and the channel recess 1265 can be formed. Alternatively, the resonator plate 1250 may comprise an arbitrary geometry that can include concave, and/or convex surfaces.

The propagation of EM energy in the resonator plate 1250 may be characterized by an effective wavelength (λ) for a given frequency of EM energy and dielectric constant for the resonator plate 1250. The plate thickness 1251 may be an integer number of quarter wavelengths (nλ/4), where n is an integer greater than zero) or an integer number of half wavelengths (mλ/2), where m is an integer greater than zero). For instance, the plate thickness 1251 may be about a half wavelength thick (λ/2) or greater than about half the effective wavelength (>λ/2). Alternatively, the plate thickness 1251 may range from about 25 mm (millimeters) to about 45 mm.

As an example, the first recesses 1255 can be located near an inner region of the plasma-facing surface 1260. In addition, the channel recesses 1265 can be located near an outer region of the plasma-facing surface 1260.

The first diameter 1257, the first channel width 1267, the second channel width 1268, the opening width 1292, and the passage width 1297 can be an integer number of quarter wavelengths (nλ/4), where n is an integer greater than zero) or an integer number of half wavelengths (mλ/2), where m is an integer greater than zero). Additionally, a first difference 1253 between the plate thickness 1251 and the first depth 1256 may be an integer number of quarter wavelengths (nλ/4), where n is an integer greater than zero) or an integer number of half wavelengths (mλ/2, where m is an integer greater than zero). For instance, the first diameter 1257, the first channel width 1267, the second channel width 1268, and the opening width 1292, and the passage width 1297 can be about one half the effective wavelength (λ/2), and a first difference 1253 between the plate thickness 1251 and the first depth 1256 may be about half the effective wavelength (λ/2) or about quarter the effective wavelength (λ/4). The plate thickness 1251 may be about half the effective wavelength (λ/2) or greater than half the effective wavelength (>λ/2).

Alternatively, the first diameter 1257, the first channel width 1267, the second channel width 1268, the opening width 1292, and the passage width 1297 may range from about 10 mm to about 35 mm, and the first difference 1253 between the plate thickness 1251 and the depths (1256, 1266, 1291, and 1296) may range from about 10 mm to about 35 mm.

In the first recesses 1255, the channels recesses 1265, the openings 1290, and/or the gas passages 1295, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1260. For example, the surface radius may range from about 1 mm to about 3 mm.

In addition, as shown in FIG. 12, the EM wave launcher 1232 can be fabricated with a mating element 1262 having a first mating length 1262a and a first mating width. The mating element 1262 may comprise an edge wall extension located at or near a periphery of the resonator plate 1250 and can be configured to couple with the process chamber wall.

Furthermore, the EM wave launcher may comprise an opening 1290 and a gas passage 1295. The opening 1290 may be configured to receive fastening devices for securing a gas line through the inner portion of the antenna 1246 to the gas passage 1295 in resonator plate 1250.

Although only one gas passage is shown, additional gas passages may be fabricated in the resonator plate 1250. Moreover, although the shape of the gas passage is straight having a cylindrical cross-section, it may be arbitrary, e.g., helical having an arbitrary cross-section. Any one or more of these features described in FIG. 12 may be implemented in any one of the embodiments described in FIGS. 8 through 11.

The channel widths (1267 and 1268) can be an integer number of quarter wavelengths (nλ/4), where n is an integer greater than zero) or an integer number of half wavelengths (mλ/2), where m is an integer greater than zero). Additionally, a second difference 1263 between the plate thickness 1251 and the channel depth 1266 may be an integer number of quarter wavelengths (nλ/4), where n is an integer greater than zero) or an integer number of half wavelengths (mλ/2), where m is an integer greater than zero). For instance, the channel widths (1267 and 1268) may be about half the effective wavelength (λ/2), and a second difference 1263 between the plate thickness 1251 and the channel depth 1266 may be about half the effective wavelength (λ/2) or about quarter the effective wavelength (λ/4).

Alternatively, the channel widths (1267 and 1268) may range from about 25 mm (millimeters) to about 35 mm, and the second difference 1263 between the plate thickness 1251 and the channel depth 1266 may range from about 10 mm to about 35 mm. Alternatively yet, the channel widths (1267 and 1268) may range from about 30 mm to about 35 mm, and the second difference may range from about 10 mm to about 20 mm.

In the channel recess 1265, rounds and/or fillets (i.e., surface/corner radius) may be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1260. For example, the surface radius may range from about 1 mm to about 3 mm.

FIG. 13A illustrates a bottom view of an EM wave launcher in accordance with embodiments of the invention, and FIG. 13B illustrates a schematic cross-sectional view of a portion of the EM wave launcher depicted in FIG. 13A. FIG. 13A illustrates a bottom view of an exemplary EM wave launcher 1332, and a plurality of slots (1348 and 1349) in the slotted antenna 1346 are illustrated as if one can see through resonator plate 1350 to the slotted antenna 1346. As shown in FIG. 13A, the plurality of slots (1348 and 1349) can be arranged in pairs, and each of the pair of slots comprises a first slot oriented orthogonal to a second slot. However, the orientation of slots in the plurality of slots (1348 and 1349) can be arbitrary. For example, the orientation of slots in the plurality of slots (1348 and 1349) can be according to a pre-determined pattern for plasma uniformity and/or plasma stability.

In some embodiments, a first recess 1355 can be configured in the resonator plate 1350, and the outer edge of the first recess 1355 can be substantially aligned with the second slots 1349 in the slotted antenna 1346. Alternatively, the first recess 1355 may be smaller and may be aligned or partially aligned with one or more of the first slots 1348 in the slotted antenna 1346. In addition, the first recess 1355 can have a trapezoidal or frusto-triangular cross-section. However, the first recess 1355 may comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The first recess 1355 may comprise a recess depth 1356, a first recess width 1357, and a second recess width 1358.

In addition, as shown in FIG. 13B, the EM wave launcher 1332 can be fabricated with a mating element 1362 having a first mating length 1062a and a first mating width. The mating element 1362 may comprise an edge wall extension located at or near a periphery of the resonator plate 1350 and can be configured to couple with the process chamber wall. Furthermore, the EM wave launcher may comprise an opening 1390 and a gas passage 1395. The opening 1390 may be configured to receive fastening devices for securing a gas line through the inner portion of the antenna 1346 to the gas passage 1395 in resonator plate 1350.

Although only one gas passage is shown, additional gas passages may be fabricated in the resonator plate 1350. Moreover, although the shape of the gas passage is straight having a cylindrical cross-section, it may be arbitrary, e.g., helical having an arbitrary cross-section. Any one or more of these features described in FIGS. 13A and 13B may be implemented in any one of the embodiments described in FIGS. 8 through 12.

In some embodiments, opening 1390 can include an opening depth 1391 and an opening width 1392, and the gas passage 1395 can include a passage length 1396 and passage width 1397. For example, the opening 1390 and the gas passage 1395 can be substantially aligned with the center of the resonator plate 1350. Alternatively, the opening 1390 and the gas passage 1395 may be aligned differently.

Referring still to FIG. 13A and FIG. 13B, an exemplary EM wave launcher 1332 is illustrated that can include a resonator plate 1350 with plasma-facing surface 1360. The EM wave launcher 1332 further comprises a slotted antenna 1346 having a plurality of first slots 1348 and a plurality of second slots 1349. The first slots 1348 and the second slots 1349 permit the coupling of EM energy from a first region above the slotted antenna 1346 to a second region below the slotted antenna wherein the resonator plate 1350 is located.

The number, geometry, size, and distribution of the first slots 1348 and second slots 1349 can be factors that can contribute to the spatial uniformity and stability of the plasma formed in process space (115, FIG. 1), and the design of the slotted antenna 1346 may be used to control the spatial uniformity and stability of the plasmas in the process space (115, FIG. 1).

Still referring to FIG. 13A and FIG. 13B, the resonator plate 1350 comprises a dielectric plate having a plate thickness 1351 and a plate diameter 1352. For example, the plasma-facing surface 1360 on resonator plate 1350 can comprise a planar surface 1361 within which the first recess 1355 can be formed. Alternatively, the resonator plate 1350 may comprise an arbitrary geometry that can include concave, and/or convex surfaces.

The propagation of EM energy in the resonator plate 1350 may be characterized by an effective wavelength ($\lambda$) for a given frequency of EM energy and dielectric constant for the resonator plate 1350. The plate thickness 1351 may be an integer number of quarter wavelengths (n$\lambda$/4), where n is an integer greater than zero) or an integer number of half wavelengths (m$\lambda$/2), where m is an integer greater than zero). For instance, the plate thickness 1351 may be about a half wavelength thick ($\lambda$/2) or greater than about half the effective wavelength (>$\lambda$/2). Alternatively, the plate thickness 1351 may range from about 25 mm (millimeters) to about 45 mm.

The first recess width 1357, the second recess width 1368, the opening width 1392, and the gas passage width 1397 can be an integer number of quarter wavelengths (n$\lambda$/4), where n is an integer greater than zero) or an integer number of half wavelengths (m$\lambda$/2), where m is an integer greater than zero). Additionally, a first difference 1353 between the plate thickness 1351 and the first depth 1356 may be an integer number of quarter wavelengths (n$\lambda$/4), where n is an integer greater than zero) or an integer number of half wavelengths (m$\lambda$/2), where m is an integer greater than zero). For instance, the first recess width 1357, the second recess width 1368, the opening width 1392, and the gas passage width 1397 can be about one half the effective wavelength ($\lambda$/2), and a first difference 1353 between the plate thickness 1351 and the first depth 1356 may be about half the effective wavelength ($\lambda$/2) or about quarter the effective wavelength ($\lambda$/4). The plate thickness 1351 may be about half the effective wavelength ($\lambda$/2) or greater than half the effective wavelength (>$\lambda$/2).

Alternatively, the first recess width 1357, the second recess width 1368, the opening width 1392, and the gas passage width 1397 may range from about 2 mm to about 35 mm, and the first difference 1353 between the plate thickness 1351 and the depths (1356, 1366, and 1396) may range from about 2 mm to about 35 mm.

In the first recess 1355, the opening 1390, and/or the gas passage 1395, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1360. For example, the surface radius may range from about 1 mm to about 3 mm.

FIG. 14A illustrates a bottom view of an EM wave launcher in accordance with embodiments of the invention, and FIG. 14B illustrates a schematic cross-sectional view of a portion of the EM wave launcher depicted in FIG. 14A. FIG. 14A illustrates a bottom view of an exemplary EM wave launcher 1432, and a plurality of slots (1448 and 1449) in the slotted antenna 1446 are illustrated as if one can see through resonator plate 1450 to the slotted antenna 1446. As shown in FIG. 14A, the plurality of slots (1448 and 1449) can be arranged in pairs, and each of the pair of slots comprises a first slot oriented orthogonal to a second slot. However, the orientation of slots in the plurality of slots (1448 and 1449) can be arbitrary. For example, the orientation of slots in the plurality of slots (1448 and 1449) can be according to a pre-determined pattern for plasma uniformity and/or plasma stability.

In some embodiments, a channel recess 1455 can be configured in the resonator plate 1450, and the channel recess 1455 can be substantially aligned with the second slots 1449 in the slotted antenna 1446. Alternatively, the channel recess 1455 may be smaller and may be aligned or partially aligned with one or more of the first slots 1448 in the slotted antenna 1446. In addition, the channel recess 1455 can comprise an arbitrary geometry including, for example, a cylindrical geometry, a conical geometry, a frusto-conical geometry, a spherical geometry, an aspherical geometry, a rectangular geometry, a pyramidal geometry, or any arbitrary shape. The channel recess 1455 may comprise a channel depth 1456, a first channel width 1457, and a second channel width 1458.

In addition, as shown in FIG. 14B, the EM wave launcher 1432 can be fabricated with an opening 1490 and a gas passage 1495. The opening 1490 may be configured to receive fastening devices for securing a gas line through the inner portion of the antenna 1446 to the gas passage 1495 in resonator plate 1450.

Although only one gas passage is shown, additional gas passages may be fabricated in the resonator plate 1450. Moreover, although the shape of the gas passage is straight having a cylindrical cross-section, it may be arbitrary, e.g., helical having an arbitrary cross-section. Any one or more of these features described in FIGS. 14A and 14B may be implemented in any one of the embodiments described in FIGS. 3 through 9.

In some embodiments, opening 1490 can include an opening depth 1491 and an opening width 1492, and the gas passage 1495 can include a passage length 1496 and passage width 1497. For example, the opening 1490 and the gas passage 1495 can be substantially aligned with the center of the resonator plate 1450. Alternatively, the opening 1490 and the gas passage 1495 may be aligned differently.

Referring still to FIG. 14A and FIG. 14B, an exemplary EM wave launcher 1432 is illustrated that can include a resonator plate 1450 with plasma-facing surface 1460. The EM wave launcher 1432 further comprises a slotted antenna 1446 having a plurality of first slots 1448 and a plurality of second slots 1449. The first slots 1448 and the second slots 1449 permit the coupling of EM energy from a first region above the slotted antenna 1446 to a second region below the slotted antenna wherein the resonator plate 1450 is located.

The number, geometry, size, and distribution of the first slots 1448 and second slots 1449 can be factors that can contribute to the spatial uniformity and stability of the plasma formed in process space (115, FIG. 1), and the design of the slotted antenna 1446 may be used to control the spatial uniformity and stability of the plasmas in the process space (115, FIG. 1).

Still referring to FIG. 14A and FIG. 14B, the resonator plate 1450 comprises a dielectric plate having a plate thickness 1451 and a plate diameter 1452. For example, the plasma-facing surface 1460 on resonator plate 1450 can comprise a planar surface 1461 within which the channel recess 1455 can be formed. Alternatively, the resonator plate 1450 may comprise an arbitrary geometry that can include concave, and/or convex surfaces.

The propagation of EM energy in the resonator plate 1450 may be characterized by an effective wavelength ($\lambda$) for a given frequency of EM energy and dielectric constant for the resonator plate 1450. The plate thickness 1451 may be an integer number of quarter wavelengths ($n\lambda/4$, where n is an integer greater than zero) or an integer number of half wavelengths ($m\lambda/2$, where m is an integer greater than zero). For instance, the plate thickness 1451 may be about a half wavelength thick ($\lambda/2$) or greater than about half the effective wavelength ($>\lambda/2$). Alternatively, the plate thickness 1451 may range from about 25 mm (millimeters) to about 45 mm.

The first channel width 1457, the second channel width 1458, the opening width 1492, and the gas passage width 1497 can be an integer number of quarter wavelengths ($n\lambda/4$, where n is an integer greater than zero) or an integer number of half wavelengths ($m\lambda/2$, where m is an integer greater than zero). Additionally, a first difference 1453 between the plate thickness 1451 and the first depth 1456 may be an integer number of quarter wavelengths ($n\lambda/4$, where n is an integer greater than zero) or an integer number of half wavelengths ($m\lambda/2$, where m is an integer greater than zero). For instance, the channel width, the opening width 1492, and the gas passage width 1497 can be about one half the effective wavelength ($\lambda/2$). Alternatively, the opening width 1492, and the gas passage width 1497 may range from about 2 mm to about 15 mm, and the first difference 1453 between the plate thickness 1451 and the depths (1456, 1491, and 1496) may range from about 1 mm to about 35 mm.

In the channel recess 1455, the opening 1490, and/or the gas passage 1495, rounds and/or fillets (i.e., surface/corner radius) can be utilized to affect smooth surface transitions between adjacent surfaces. In a cylindrical recess, a surface radius may be disposed at the corner between the cylindrical sidewall and the bottom of the recess. Additionally, in a cylindrical recess, a surface radius may be disposed at the corner between the cylindrical sidewall and the plasma-facing surface 1460. For example, the surface radius may range from about 1 mm to about 3 mm.

Although not shown in any one of the embodiments provided in FIGS. 8 through 14, one or more recesses may be interconnected. Additionally, one or more recesses of one recess configuration may be interconnected with one or more recesses of another recess configuration. For example, one or more recesses may be interconnected or linked by a groove or channel.

FIG. 15 illustrates a flow diagram for an exemplary operating procedure for a SWP processing system in accordance with embodiments of the invention. A multi-step procedure 1500 is shown in FIG. 15. Alternatively, other steps may be included.

In 1510, a Surface Wave Plasma (SWP) source can be coupled to a process chamber (110, FIG. 1). During various DC/SWP-related procedures, the SWP sources (150, FIG. 1) can comprise an electromagnetic (EM) wave launcher (832, FIGS. 8A and 8B), or the EM wave launcher (932, FIGS. 9A and 9B), or the EM wave launcher (1032, FIGS. 10A and 10B), or the EM wave launcher (1132, FIGS. 11A and 11B), or the EM wave launcher (1232, FIGS. 12A and 12B), or the EM wave launcher (1332, FIGS. 13A and 13B), or the EM wave launcher (1432, FIGS. 14A and 14B), or any combination thereof. In addition, the plasma-facing surfaces (161, FIG. 1) of the SWP sources (150, FIG. 1) can comprise surface (861, FIG. 8B), or the surface (961, FIG. 9B), or the surface (1061, FIG. 10B), or the surface (1161, FIG. 11B), or the surface (1261, FIG. 12B), or the surface (1361, FIG. 13B), or the surface (1461, FIG. 14B), or any combination thereof. Furthermore, the recesses (165, FIG. 1) in the plasma-facing surfaces (161, FIG. 1) can comprise the recesses (855 and/or 865, FIGS. 8A and 8B), or the recesses (955 and/or 965, FIGS. 9A and 9B), or the recesses (1055 and/or 1065, FIGS. 10A and 10B), or the recesses (1155, 1165, and/or 1195, FIGS. 11A and 11B), or the recesses (1255 and/or 1265, FIGS. 12A and 12B), or the recesses (1355, FIGS. 13A and 13B), or the recesses (1455, FIGS. 14A and 14B), or any combination thereof.

The EM energy can be coupled to the SWP source 150 via the feed assembly 140, and one or more mode changes can occur in the feed assembly 140. Additional details regarding the design of the feed assembly 140 and the slot antenna 146 can be found in U.S. Pat. No. 5,024,716, entitled "Plasma processing apparatus for etching, ashing, and film-formation"; the content of which is herein incorporated by reference in its entirety.

In 1515, a Direct Current (DC) ring subsystem (175, FIG. 1) can be coupled to the process chamber (110, FIG. 1). During various DC/SWP-related procedures, the DC ring subsystem (175, FIG. 1) can be coupled to at least one distribution subsystem (172, FIG. 1) that can be coupled to one or more power subsystem (170, FIG. 1). The DC ring subsystem (175, FIG.) can comprise a non-segmented configuration (275, FIGS. 2A and 2B); can comprise a first segmented configuration (375*a*-375*h*, FIGS. 3A and 3B); can comprise a second segmented configuration (475*a*-475*h*, FIGS. 4A and 4B); can comprise a third segmented configuration (575*a*-575*h*, FIGS. 5A and 5B); can comprise a fourth segmented configuration (675*a*-675*h*, FIGS. 6A and 6B); or can comprise a fifth segmented configuration (775*a*-775*h*, FIGS. 7A and 7B), or any combination thereof. Alternatively, segmented or non-segmented ring subsystems may be used.

The distribution subsystem (172, FIG.) can comprise a non-segmented configuration (272, FIGS. 2A and 2B); can comprise a second non-segmented configuration (372, FIGS. 3A and 3B); can comprise a first segmented configuration (472*a*-472*h*, FIGS. 4A and 4B); can comprise a third non-segmented configuration (572, FIGS. 5A and 5B); can comprise a second segmented configuration (672*a*-672*h*, FIGS. 6A and 6B); or can comprise a fourth non-segmented configuration (772, FIGS. 7A and 7B), or any combination thereof. Alternatively, segmented or non-segmented distribution subsystems may be used.

The power subsystem (170, FIG.) can comprise a non-segmented configuration (270, FIGS. 2A and 2B); can comprise a second non-segmented configuration (370, FIGS. 3A and 3B); can comprise a first segmented configuration (470*a*-470*h*, FIGS. 4A and 4B); can comprise a third non-segmented configuration (570, FIGS. 5A and 5B); can comprise a second segmented configuration (670a-670h, FIGS. 6A and 6B); or can comprise a fourth non-segmented configuration (770, FIGS. 7A and 7B), or any combination thereof. Alternatively, segmented or non-segmented power subsystems may be used.

In 1520, a substrate (105, FIG. 1) can be positioned on a substrate holder (120, FIG. 1) in a process chamber (110, FIG. 1), and one or more SWP sources (150, FIG. 1) can be coupled to the process chamber (110, FIG. 1).

In 1525, process gas can be supplied into the process chamber (110, FIG. 1). During dry plasma etching, the process gas may comprise an etchant, a passivant, or an inert gas, or a combination of two or more thereof. For example, when plasma etching a dielectric film such as silicon oxide ($SiO_x$) or silicon nitride ($Si_xN_y$), the plasma etch gas composition generally includes a fluorocarbon-based chemistry ($C_xF_y$) such as at least one of $C_4F_8$, $C_5F_8$, $C_3F_6$, $C_4F_6$, $CF_4$, etc., and/or may include a fluorohydrocarbon-based chemistry ($C_xH_yF_z$) such as at least one of $CHF_3$, $CH_2F_2$, etc., and can have at least one of an inert gas, oxygen, CO or $CO_2$. Additionally, for example, when etching polycrystalline silicon (poliesilicon), the plasma etch gas composition generally includes a halogen-containing gas such as HBr, $Cl_2$, $NF_3$, or $SF_6$ or a combination of two or more thereof, and may include fluorohydrocarbon-based chemistry ($C_xH_yF_z$) such as at least one of $CHF_3$, $CH_2F_2$, etc., and at least one of an inert gas, oxygen, CO or $CO_2$, or two or more thereof. During plasma-enhanced deposition, the process gas may comprise a film forming precursor, a reduction gas, or an inert gas, or a combination of two or more thereof.

In 1530, one or more tunable EM signals can be provided to at least one SWP source (150, FIG. 1). In some embodiments, one or more EM sources (190, FIG. 1) can be coupled to the SWP source (150, FIG. 1) that can comprise a slot antenna (146, FIG. 1) coupled to a resonator plate (160, FIG. 1). For example, the controller can control the tunable EM signals in real-time when creating a uniform DC/SWP plasma, and the tunable EM signals can vary from about 0 watts to about 5000 watts.

One or more controllers (195, FIG. 1) can be coupled to the EM source (190, FIG. 1), the match network/phase shifter (191, FIG. 1), the tuner network/isolator (192, FIG. 1), and at least one controller (195, FIG. 1) can use process recipes to establish, control, and optimize the EM source (190, FIG. 1), the match network/phase shifter (191, FIG. 1), and the tuner network/isolator (192, FIG. 1) to control the DC/SWP plasma uniformity within the process space (115, FIG. 1).

In 1535, one or more tunable DC signals can be provided to at least one DC ring subsystem (175, FIG. 1). In some embodiments, one or more DC power sources (170, FIG. 1) can be coupled to the DC ring subsystem (175, FIG. 1) using one or more distribution subsystems (172, FIG. 1). For example, the controller can control the tunable DC signals in real-time when creating a uniform DC/SWP plasma, and the tunable DC signals can vary from about $-5000 \, V_{dc}$ to about $+5000 \, V_{dc}$.

One or more controllers (195, FIG. 1) can be coupled to the DC power source (170, FIG. 1), the distribution subsystem (172, FIG. 1), and the DC ring subsystem (175, FIG. 1), and at least one controller (195, FIG. 1) can use process recipes to establish, control, and optimize the DC power source (170, FIG. 1), the distribution subsystem (172, FIG. 1), and the DC ring subsystem (175, FIG. 1) to control the DC/SWP plasma uniformity within the process space (115, FIG. 1).

In addition, one or more controllers (195, FIG. 1) can be coupled to the first gas supply system (180, FIG. 1), the second gas supply subsystem (182, FIG. 1), and at least one controller (195, FIG. 1) can use process recipes to establish, control, and optimize the first gas supply system (180, FIG. 1), the second gas supply subsystem (182, FIG. 1) to control the DC/SWP plasma uniformity within the process space (115, FIG. 1).

Furthermore, one or more controllers (195, FIG. 1) can be coupled to the RF generator (130, FIG. 1), the impedance match network (131, FIG. 1), and RF sensor (135, FIG. 1), and at least one controller (195, FIG. 1) can use process recipes to establish, control, and optimize the RF generator (130, FIG. 1), the impedance match network (131, FIG. 1), and RF sensor (135, FIG. 1) to control the DC/SWP plasma uniformity within the process space (115, FIG. 1).

In 1540, the substrate can be processed using the uniform DC/SWP plasma in the process chamber (110, FIG. 1).

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

Thus, the description is not intended to limit the invention and the configuration, operation, and behavior of the present invention has been described with the understanding that modifications and variations of the embodiments are possible, given the level of detail present herein. Accordingly, the preceding detailed description is not mean or intended to, in any way, limit the invention—rather the scope of the invention is defined by the appended claims.

What is claimed is:

1. A Surface Wave Plasma (SWP) processing system for processing a substrate comprising:
    a process chamber comprising a process space having a substrate holder therein, wherein the process chamber includes a chamber wall having a cylindrical shape with a circular circumference, wherein the chamber wall surrounds the process space, and the substrate holder is positioned within the process space;
    a Surface Wave Plasma (SWP) source coupled to the process chamber, wherein the SWP plasma source comprises a slot antenna and a resonator plate coupled to the slot antenna;
    an electromagnetic (EM) source coupled to the SWP source;
    a Direct Current (DC) ring subsystem coupled through a chamber wall and configured to surround the process space;
    a power subsystem coupled to the DC ring subsystem; and
    a controller configured to control the SWP source, the EM source, the DC ring subsystem, and the power subsystem, thereby controlling plasma uniformity in the process space,
    wherein the DC ring subsystem comprises at least one cylindrical ring structure that includes a plurality of curved segments that extend inside of the chamber wall, wherein the plurality of curved segments are each circumferentially spaced apart along the circular circumference of the chamber wall and separately coupled to a distribution subsystem, and
    wherein the curved segments alternate in sequence about the circular circumference of the chamber wall between a negative DC polarity and a positive DC polarity.

2. The SWP processing system of claim 1, further comprising:
a match network/phase shifter coupled to the EM source;
a tuner network/isolator coupled to the match network/phase shifter and the SWP source, wherein the EM source is configured to operate in a frequency range from 500 MHz to 5000 MHz.

3. The SWP processing system of claim 1, wherein the distribution subsystem is configured to provide DC power from the power subsystem to the DC ring subsystem.

4. The SWP processing system of claim 1, further comprising:
a first gas supply system coupled to one or more first flow elements coupled to the process chamber, wherein the first flow elements are configured to introduce a first process gas to the process space.

5. The SWP processing system of claim 4, wherein the first process gas comprises two or more of: $C_4F_8$, $C_5F_8$, $C_3F_6$, $C_4F_6$, $CF_4$, $CHF_3$, $CH_2F_2$, an inert gas, oxygen, CO, and $CO_2$.

6. The SWP processing system of claim 4, wherein the first process gas comprises two or more of: HBr, $Cl_2$, $NF_3$, $SF_6$, $CHF_3$, $CH_2F_2$, an inert gas, oxygen, CO, and $CO_2$.

7. The SWP processing system of claim 1, wherein the DC subsystem and the power subsystem are configured to operate between ($-5000$ $V_{dc}$) and ($+5000$ $V_{dc}$).

8. The SWP processing system of claim 1, wherein the resonator plate includes one or more recesses configured therein, each recess having a diameter ($d_1$) that varies between 1 mm and 50 mm.

9. The SWP processing system of claim 1, wherein the at least one cylindrical ring structure that includes dielectric materials.

10. The SWP processing system of claim 9, wherein the distribution subsystem is coupled to the power subsystem and is configured to provide a controllable DC signal to each of the curved segments.

11. The SWP processing system of claim 1, further comprising:
a plurality of power subsystems coupled to the controller; and
a plurality of distribution subsystems, each distribution subsystem being coupled to at least one of the power subsystems, wherein each of the curved segments is separately coupled to at least one of the distribution subsystems, each of the distribution subsystems being configured to provide a controllable DC signal to each of the curved segments.

12. The SWP processing system of claim 1, wherein the plurality of curved segments are each separately coupled to a distribution subsystem, the distribution subsystem being coupled to the power subsystem and being configured to provide a controllable DC signal to each of the curved segments, wherein a plurality of ground elements are configured between two of the curved segments.

13. The SWP processing system of claim 1, further comprising:
a plurality of first power subsystems coupled to the controller;
a plurality of first distribution subsystems, each first distribution subsystem being coupled to at least one of the first power subsystems, wherein each of the first curved segments is separately coupled to at least one of the first distribution subsystems, each of the first distribution subsystems being configured to provide a controllable negative DC signal to each of the first curved segments;
a plurality of second power subsystems coupled to the controller;
a plurality of second distribution subsystems, each second distribution subsystem being coupled to at least one of the second power subsystems, wherein the at least one cylindrical ring structure includes a plurality of second curved segments, wherein each of the second curved segments is separately coupled to at least one of the second distribution subsystems, each of the second distribution subsystems being configured to provide a controllable positive DC signal to each of the second curved segments.

14. The SWP processing system of claim 1, further comprising:
a plurality of first power subsystems coupled to the controller;
a plurality of first distribution subsystems, each first distribution subsystem being coupled to at least one of the first power subsystems, wherein the DC ring subsystem comprises at least one cylindrical ring structure having a plurality of convex segments, wherein each of the convex segments is separately coupled to at least one of the first distribution subsystems, each of the first distribution subsystems being configured to provide a controllable negative DC signal to each of the convex segments.

15. The SWP processing system of claim 1, wherein the DC ring subsystem forms a diffusion column that extends along the cylindrical chamber wall.

16. The SWP processing system of claim 15, wherein the diffusion column extends downwardly from the DC ring subsystem along the cylindrical chamber wall.

17. The SWP processing system of claim 1, wherein the curved segments have a thickness in an axial direction of the cylindrical chamber wall which is from 10 mm to 50 mm.

* * * * *